(12) United States Patent
Takada et al.

(10) Patent No.: US 11,415,826 B2
(45) Date of Patent: Aug. 16, 2022

(54) TOUCH PANEL DISPLAY DEVICE

(71) Applicant: Japan Display Inc., Tokyo (JP)

(72) Inventors: Naoki Takada, Minato-ku (JP);
Takayuki Nakanishi, Minato-ku (JP);
Yuto Kakinoki, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/317,970

(22) Filed: May 12, 2021

(65) Prior Publication Data

US 2021/0263362 A1  Aug. 26, 2021

Related U.S. Application Data

(63) Continuation of application No. PCT/JP2019/035076, filed on Sep. 5, 2019.

(30) Foreign Application Priority Data

Nov. 16, 2018  (JP) ............................. JP2018-216036

(51) Int. Cl.
*G02F 1/1333* (2006.01)
*G02F 1/1362* (2006.01)
(Continued)

(52) U.S. Cl.
CPC .......... *G02F 1/13338* (2013.01); *G01L 1/225* (2013.01); *G02F 1/13629* (2021.01);
(Continued)

(58) Field of Classification Search
CPC ............. G02F 1/13338; G02F 1/13629; G02F 1/13685; G02F 1/134363; G02F 1/136227; G02F 1/1368; G01L 1/225; G01L 1/22; G01L 7/065; G06F 3/044; G06F 2203/04105; G06F 2203/04106; G06F 3/04144; G06F 3/0412; H01L 27/323
See application file for complete search history.

(56) References Cited

U.S. PATENT DOCUMENTS

2017/0023420 A1\* 1/2017 Vosgueritchian ......... G01L 1/22
2017/0031479 A1  2/2017 Kim et al.
(Continued)

FOREIGN PATENT DOCUMENTS

JP  2018-088255 A  6/2018

OTHER PUBLICATIONS

International Search Report dated Nov. 5, 2019 in PCT/JP2019/035076 filed on Sep. 5, 2019, 2 pages.

*Primary Examiner* — David D Davis
(74) *Attorney, Agent, or Firm* — Maier & Maier, PLLC

(57) ABSTRACT

A display device includes a display region in which a plurality of pixels are arrayed in a row direction and a column direction. Gate lines each configured to supply gate signals to the pixels are aligned in the row direction. Signal lines each configured to supply pixel signals to the pixels are aligned in the column direction. At least one first semiconductor force sensor is provided in the display region. At least one second semiconductor force sensor is provided in a frame region outside the display region. A detection circuit detects force applied to the display region based on a middle-point voltage between the first semiconductor force sensor and the second semiconductor force sensor.

15 Claims, 36 Drawing Sheets

(51) Int. Cl.
*G02F 1/1368* (2006.01)
*G01L 1/22* (2006.01)
G02F 1/1343 (2006.01)
G06F 3/044 (2006.01)

(52) U.S. Cl.
CPC .... *G02F 1/13685* (2021.01); *G02F 1/134363* (2013.01); *G06F 3/044* (2013.01); *G06F 2203/04105* (2013.01)

(56) References Cited

U.S. PATENT DOCUMENTS

| | | | | |
|---|---|---|---|---|
| 2017/0242524 A1* | 8/2017 | Kim | ................. | G06F 3/0445 |
| 2017/0285799 A1* | 10/2017 | Iuchi | ................. | G06F 3/0445 |
| 2017/0293388 A1* | 10/2017 | Han | ................ | G06F 3/04166 |
| 2018/0203319 A1* | 7/2018 | Yamazaki | ............ | G02F 1/1368 |
| 2018/0204532 A1* | 7/2018 | Kobayashi | ........... | G02B 27/017 |

* cited by examiner

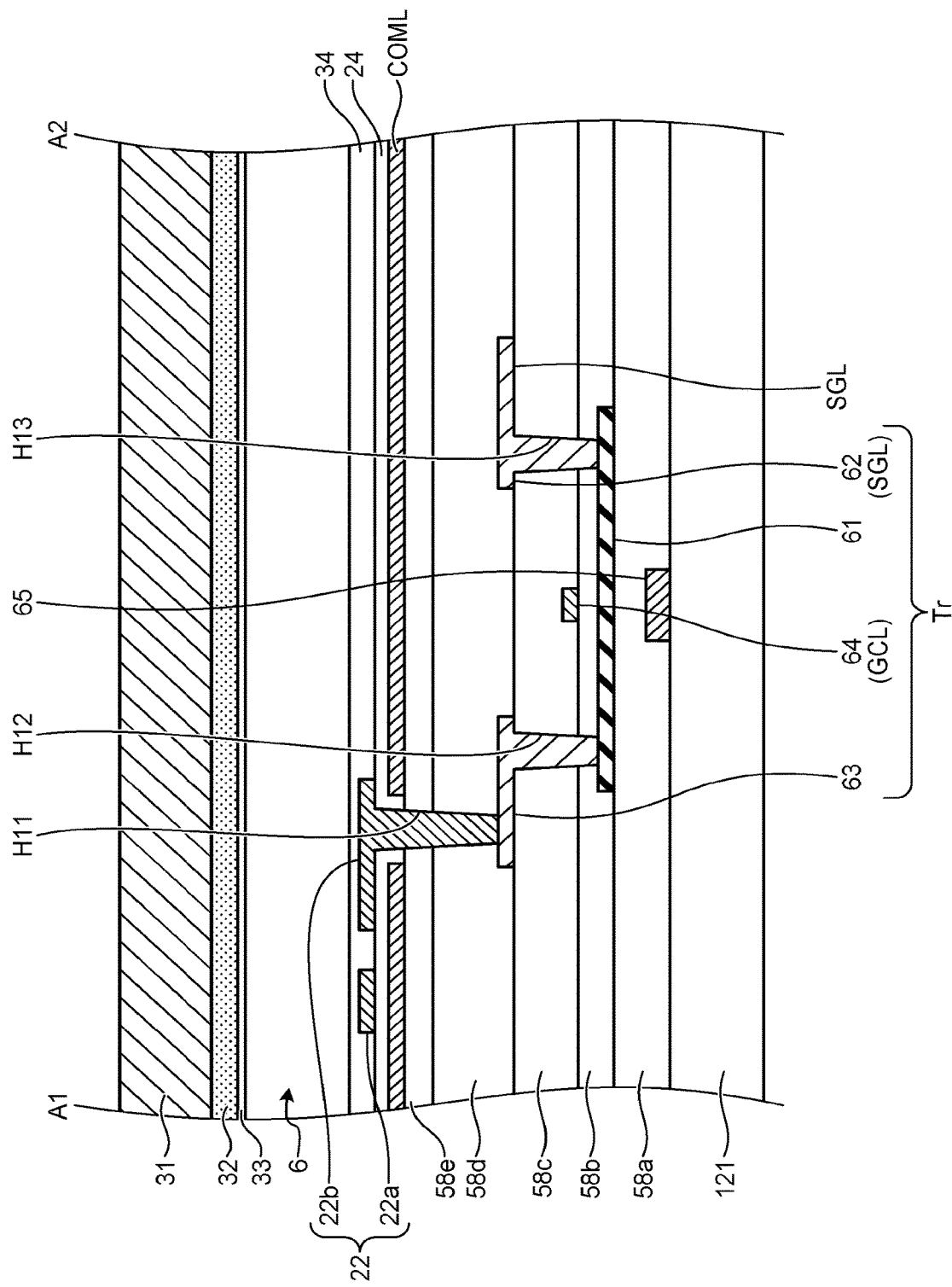

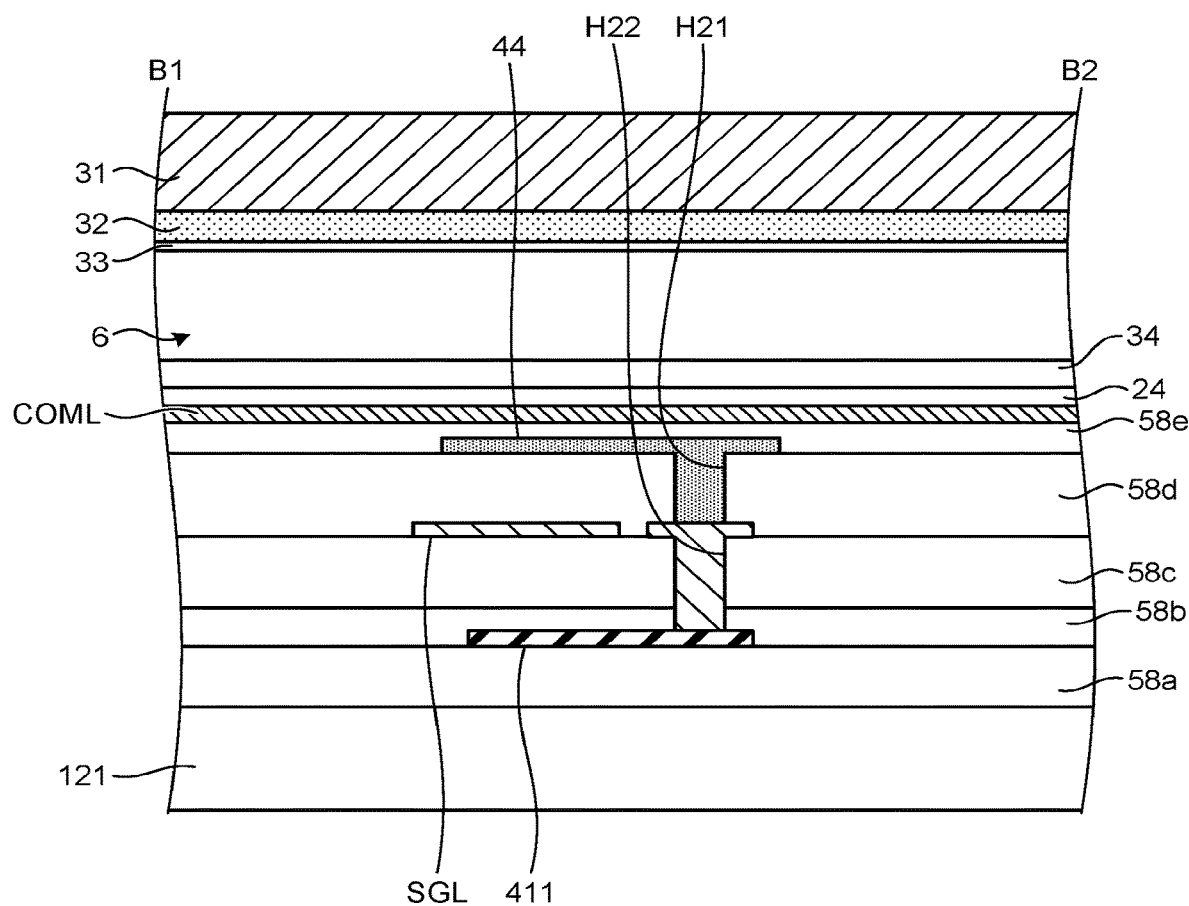

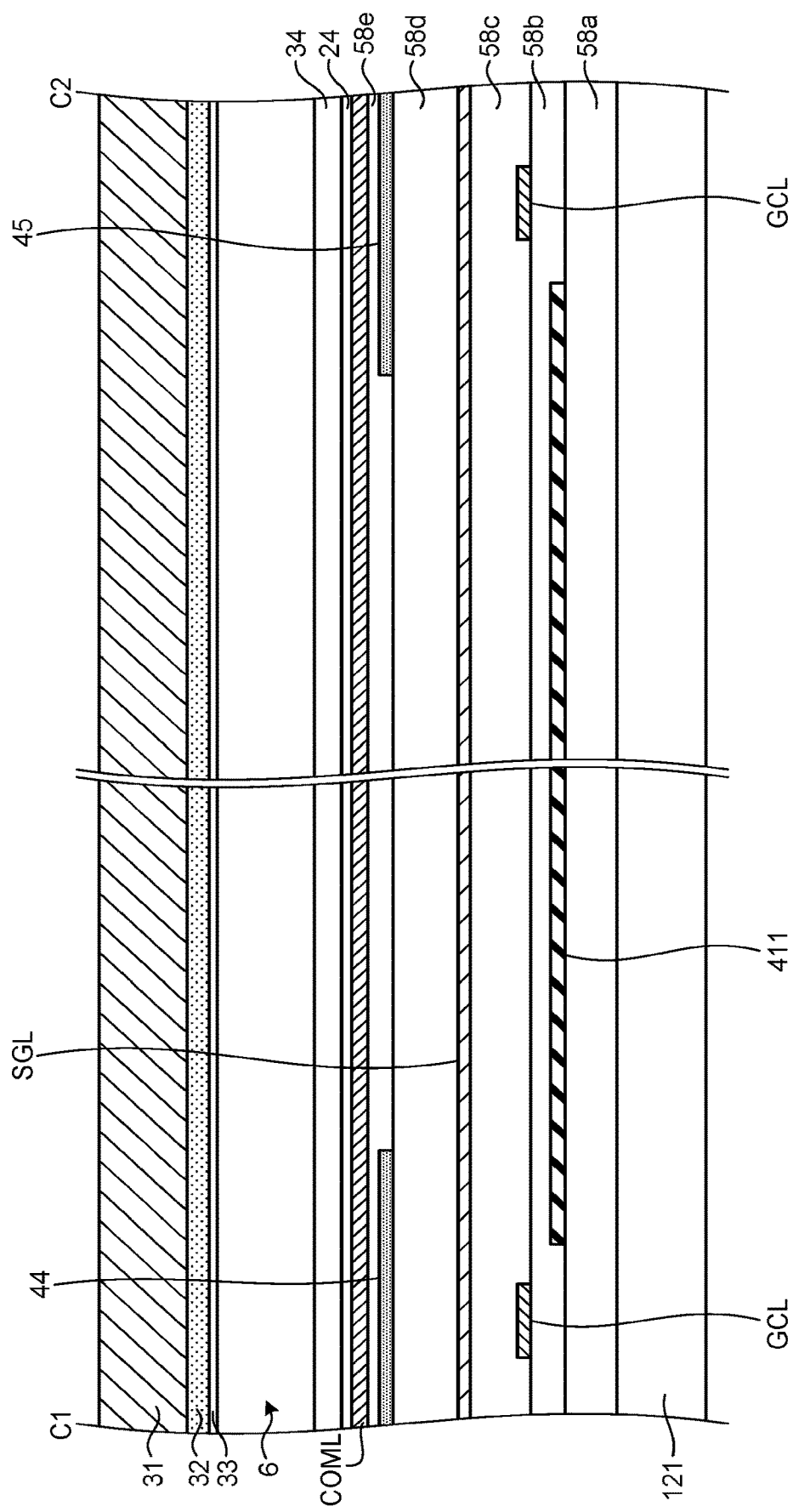

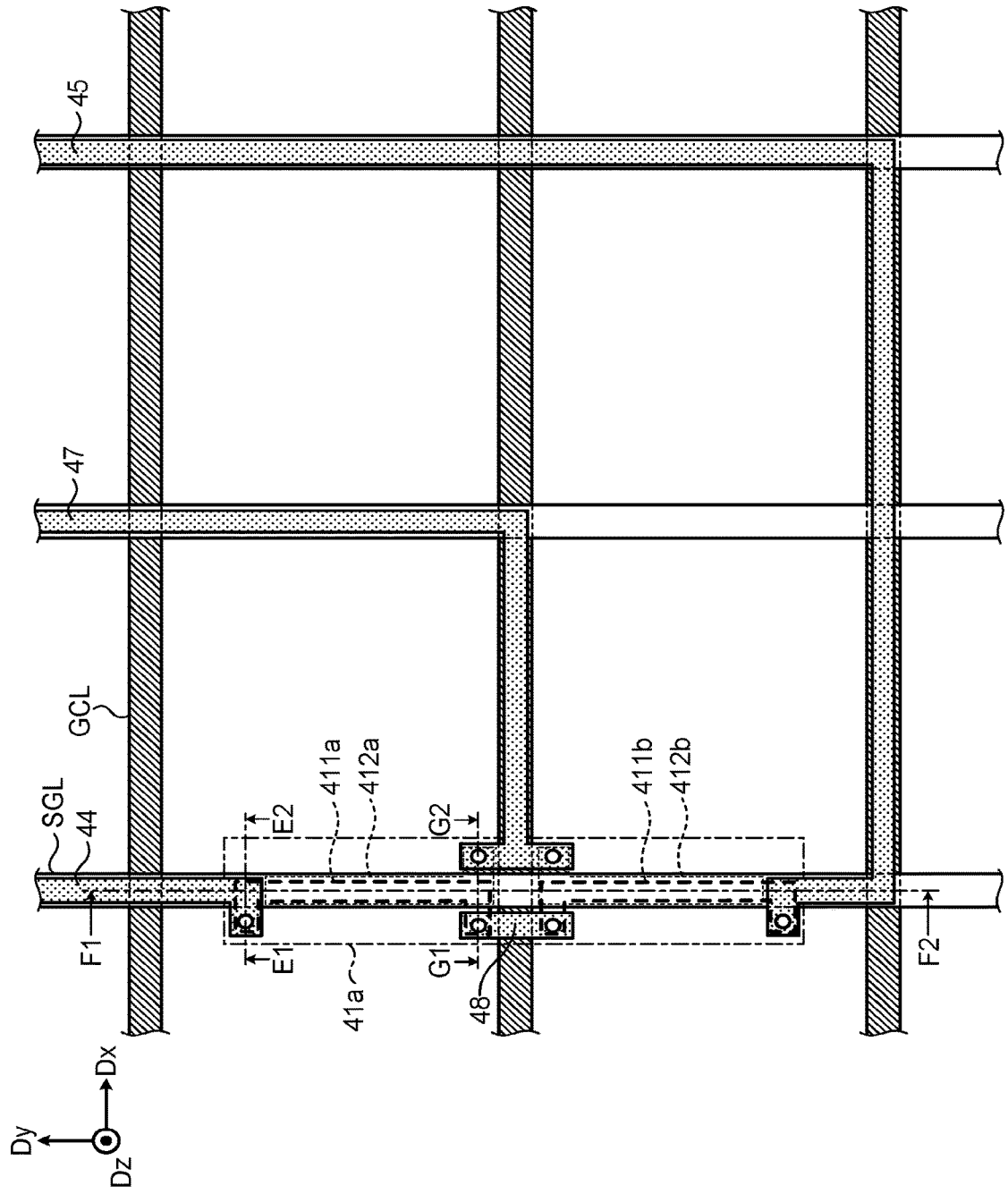

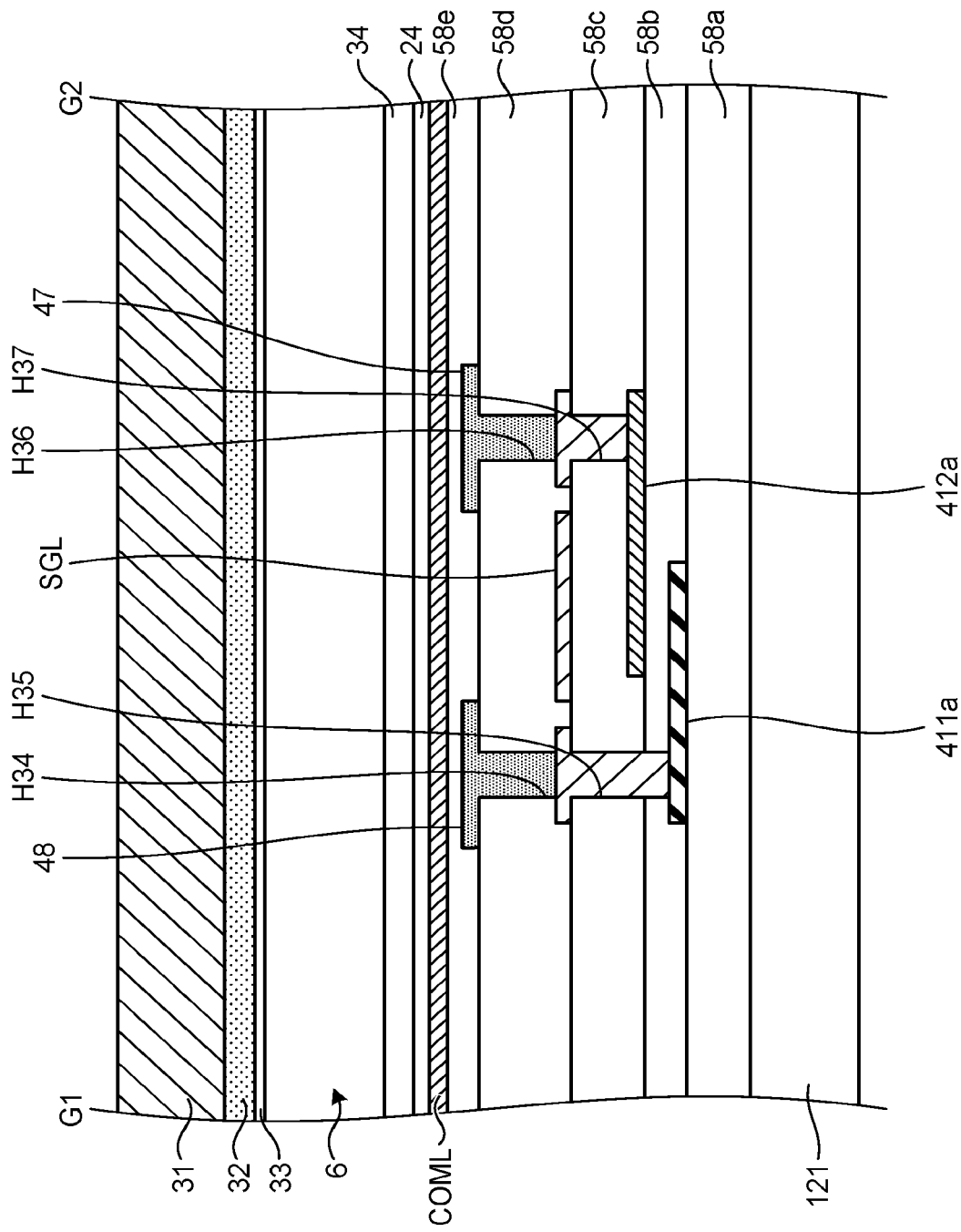

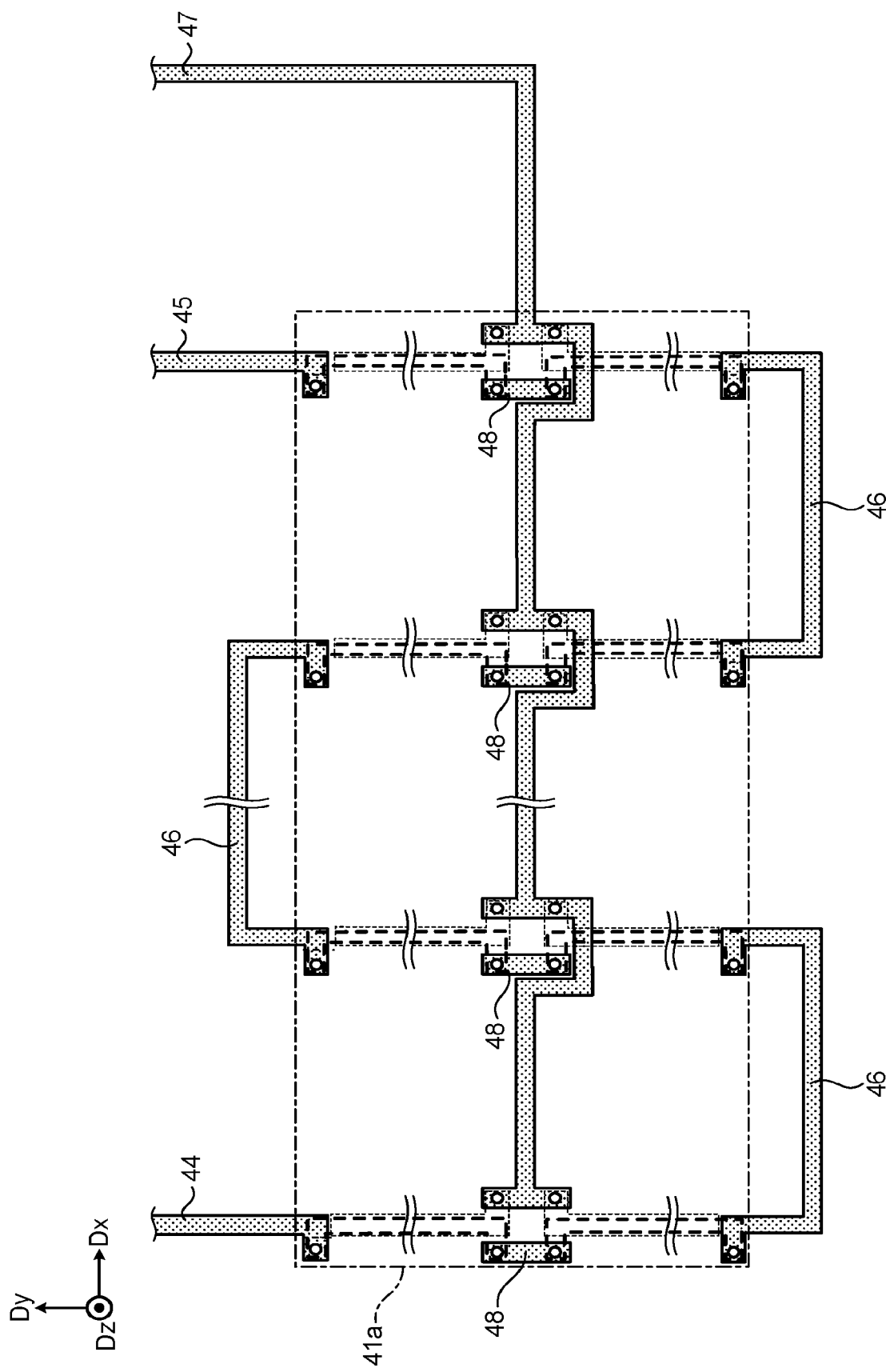

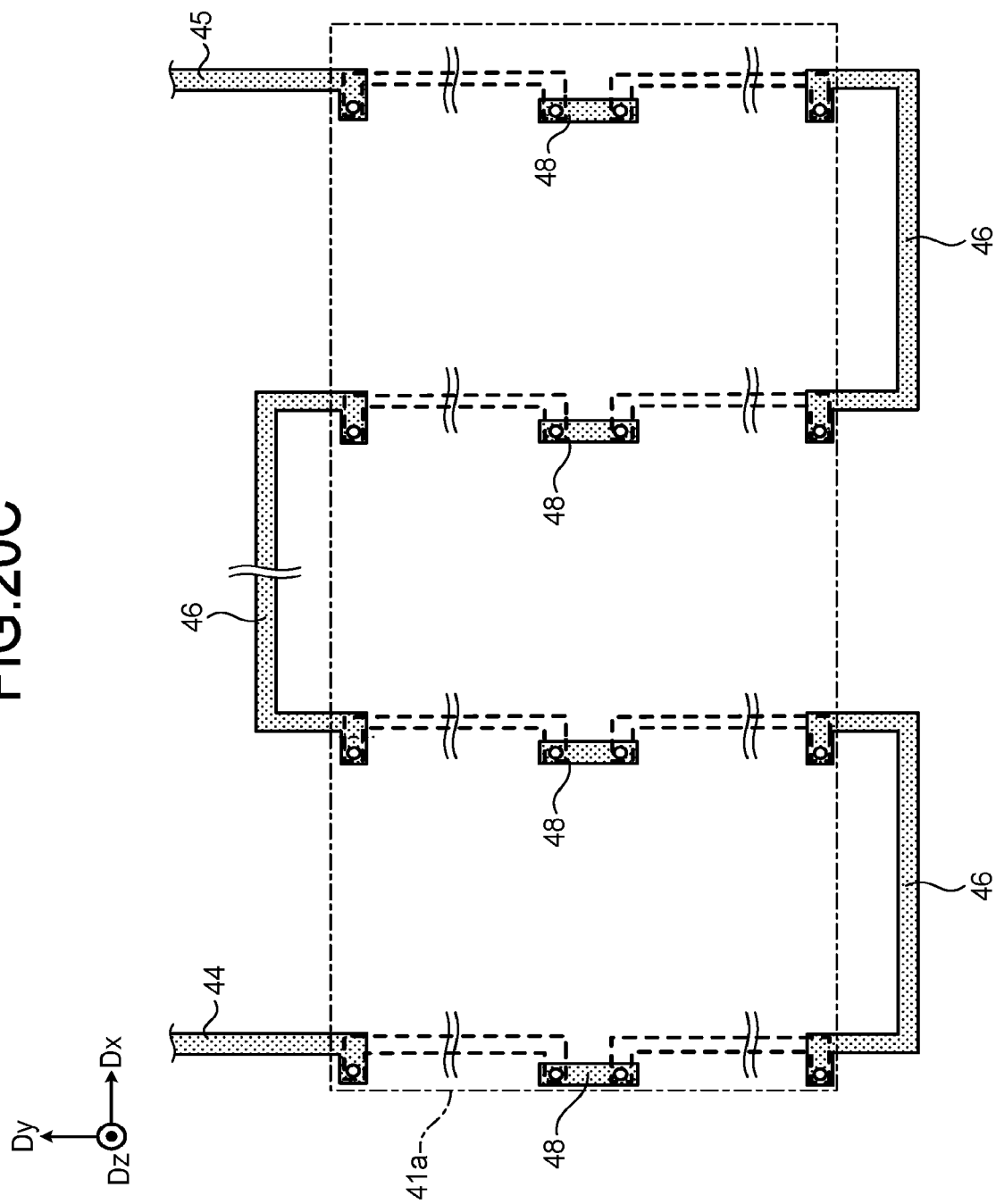

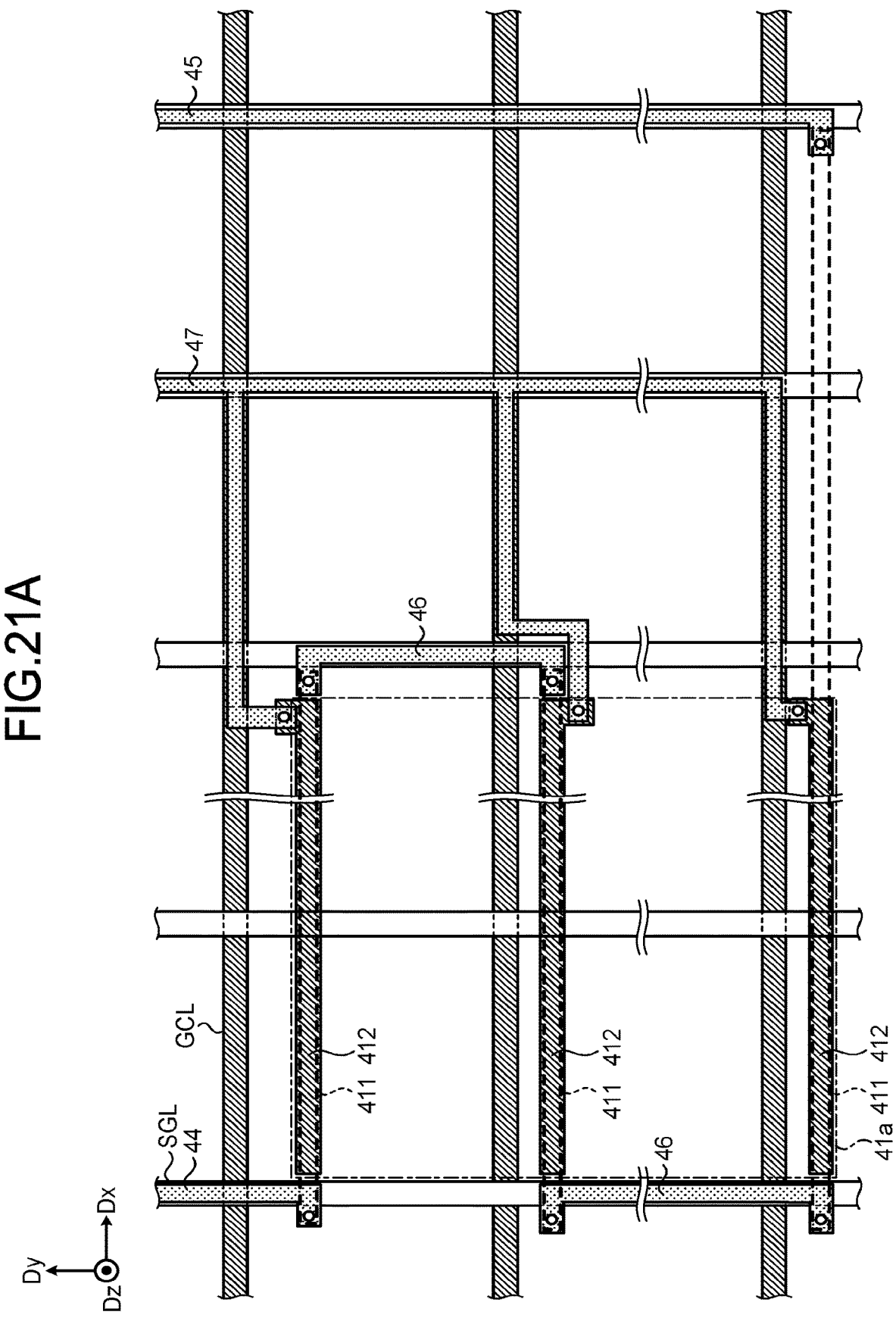

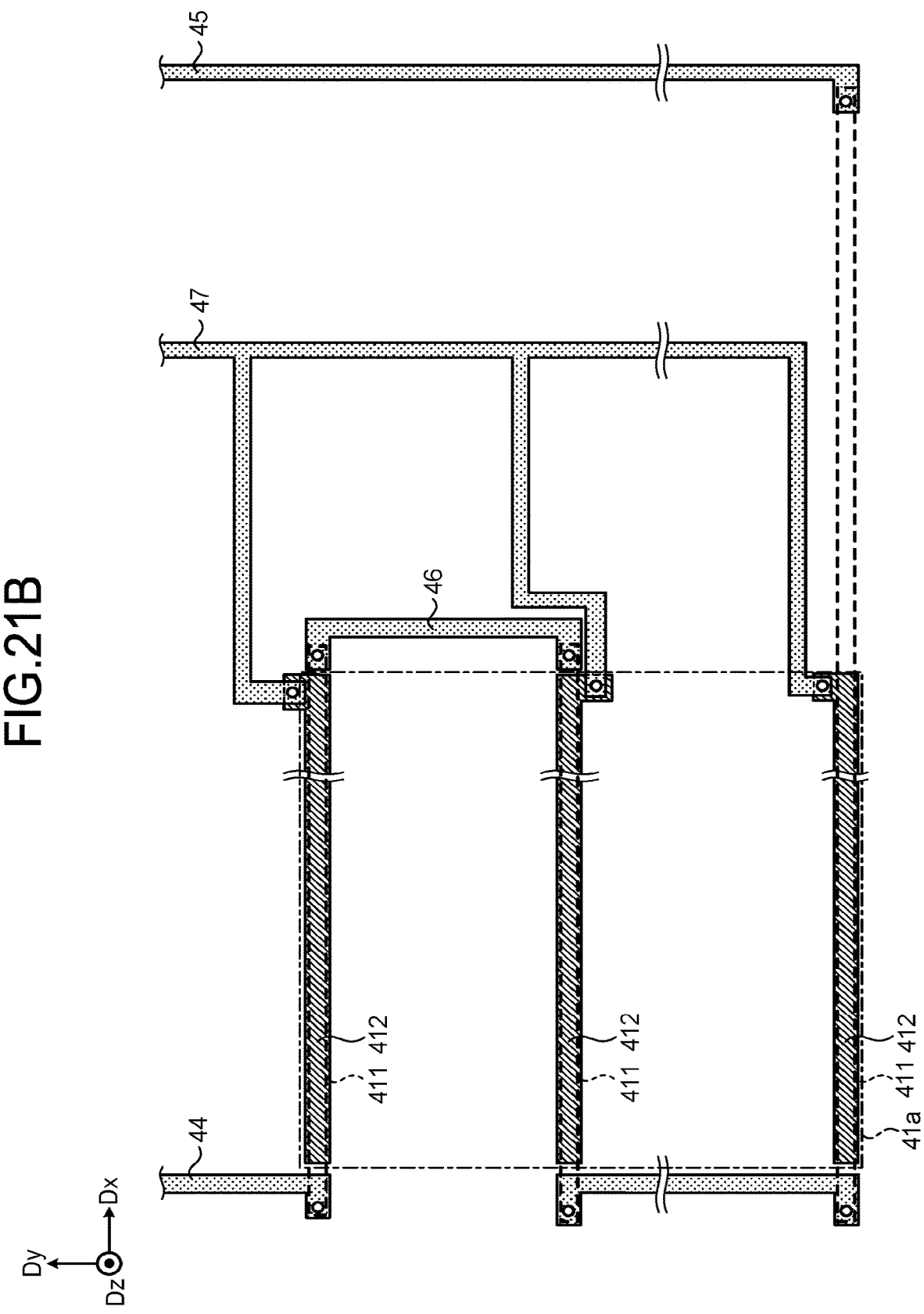

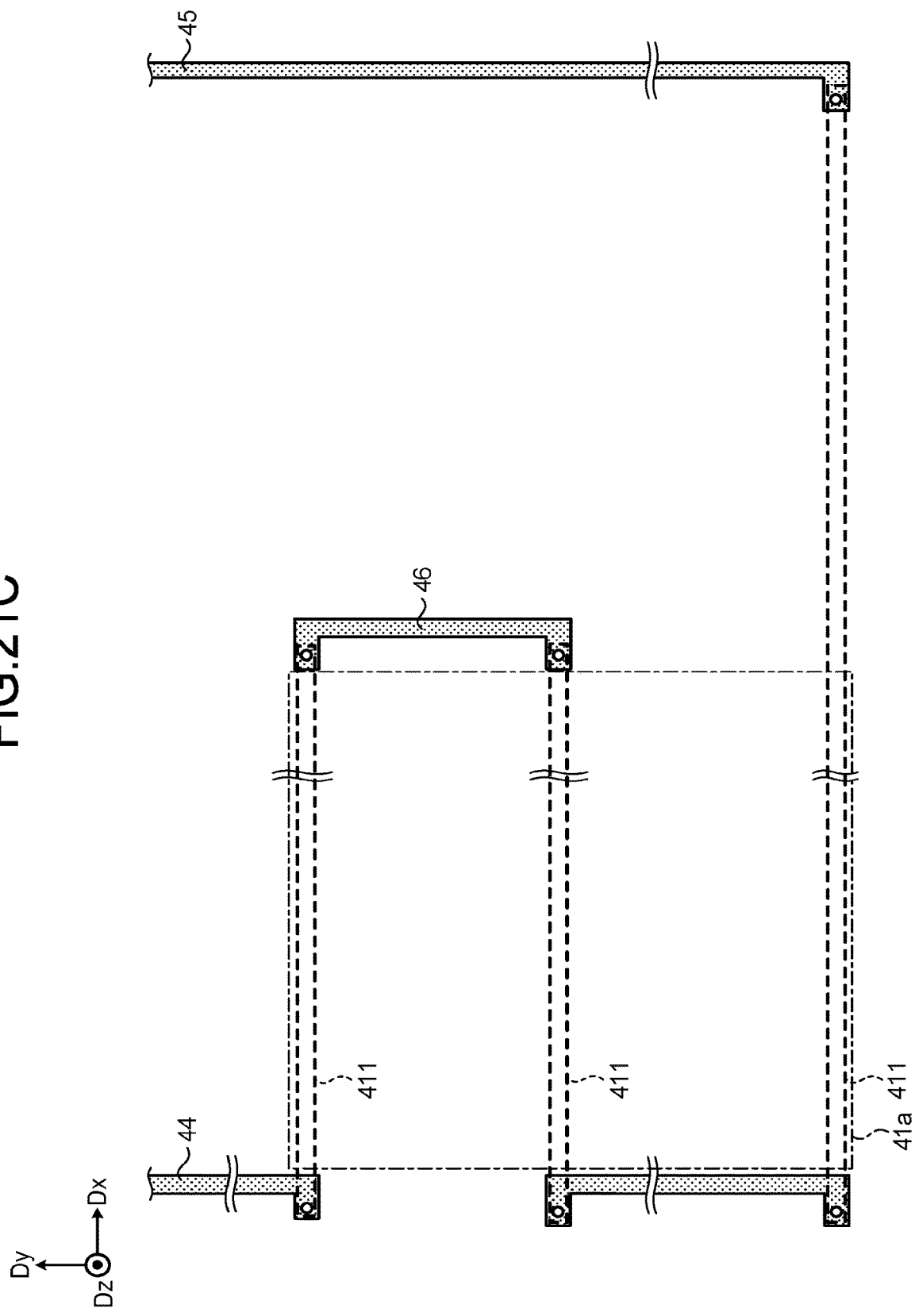

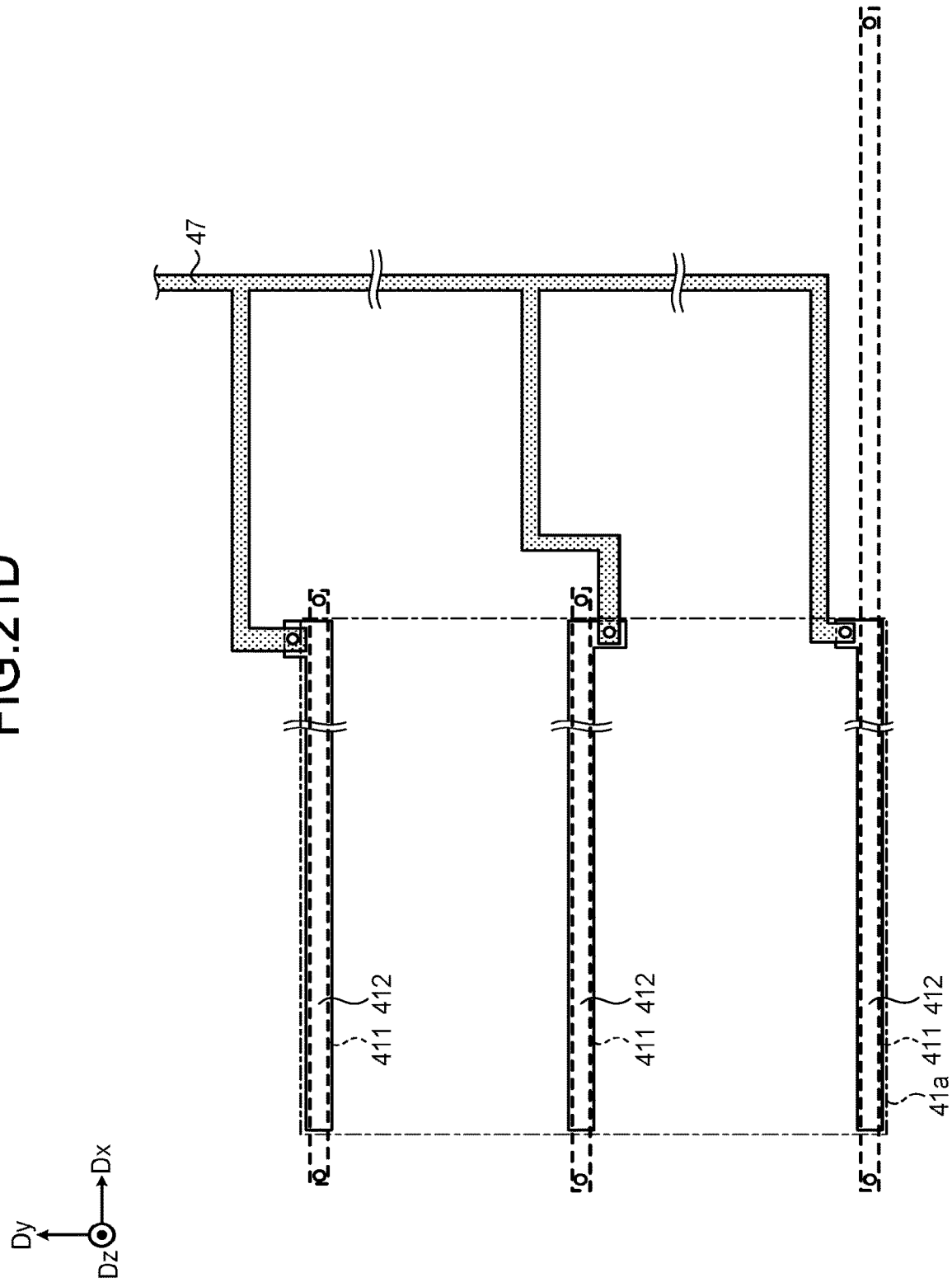

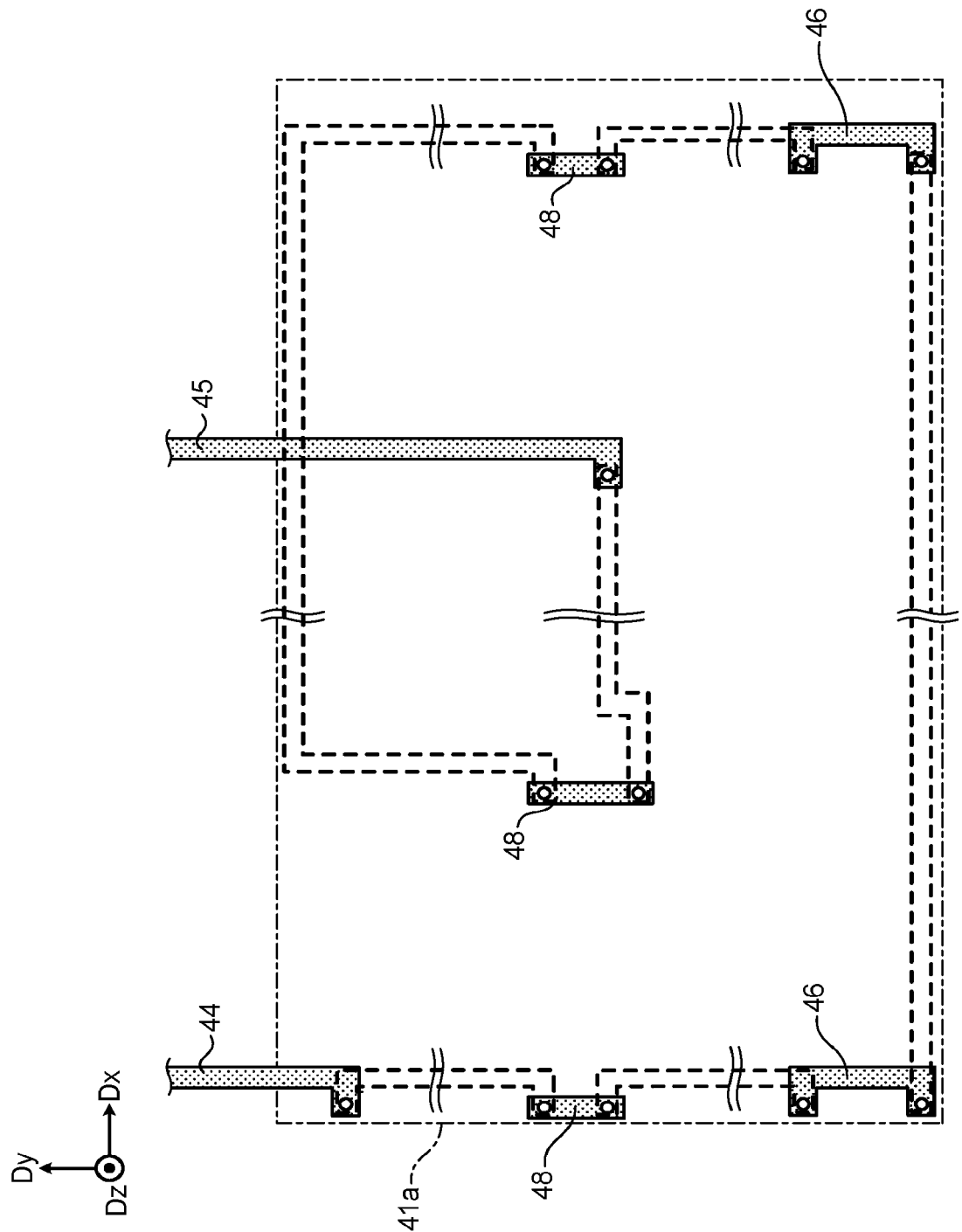

TOUCH PANEL DISPLAY DEVICE

CROSS-REFERENCE TO RELATED APPLICATION

This application claims the benefit of priority from Japanese Patent Application No. 2018-216036 filed on Nov. 16, 2018 and International Patent Application No. PCT/JP2019/035076 filed on Sep. 5, 2019, the entire contents of which are incorporated herein by reference.

BACKGROUND

1. Technical Field

What is disclosed herein relates to a display device.

2. Description of the Related Art

In recent years, touch detection devices capable of detecting an external proximity object, which are what is called touch panels, have attracted attention. The touch panels are mounted on or integrated with display devices such as liquid crystal display devices and used as display devices. Force detection devices capable of detecting force applied to a display surface of the display device in addition to detecting a touch have been also used. For example, a configuration has been known in which the force is detected based on the amount of change in electrostatic capacitance with change in a distance between a detection electrode and a reference potential layer (for example, see Japanese Patent Application Laid-open Publication No. 2018-88255).

It is disclosed that the above-mentioned conventional technique has a configuration in which a backlight unit is provided between the detection electrode and the reference potential layer. In such a configuration, when, for example, a direct-type backlight unit is used, the distance between the detection electrode and the reference potential layer is increased to lower the electrostatic capacitance, and thus the amount of change in the electrostatic capacitance cannot be possibly detected. When the force applied to the display surface of the display device is detected, the configuration for detecting the amount change in the electrostatic capacitance needs to include an electrode for force detection in a display panel, which can increase cost due to increase in the number of processes.

For the foregoing reasons, there is a need for a display device that can provide a configuration detecting force applied to a display surface at low cost.

SUMMARY

A a display device includes a display region in which a plurality of pixels are arrayed in a row direction and a column direction. Gate lines each configured to supply gate signals to the pixels are aligned in the row direction. Signal lines each configured to supply pixel signals to the pixels are aligned in the column direction. At least one first semiconductor force sensor is provided in the display region. At least one second semiconductor force sensor is provided in a frame region outside the display region. A detection circuit detects force applied to the display region based on a middle-point voltage between the first semiconductor force sensor and the second semiconductor force sensor.

BRIEF DESCRIPTION OF THE DRAWINGS

FIG. 4 is a sectional view cut along line A1-A2 in FIG. 3;

FIG. 6 is a sectional view cut along line B1-B2 in FIG. 5A;

FIG. 7 is a sectional view cut along line C1-C2 in FIG. 5A;

FIG. 16A is a plan view illustrating a first configuration example of a first semiconductor force sensor in the second embodiment;

FIG. 19 is a sectional view cut along line G1-G2 in FIG. 16A;

FIG. 20B is a plan view illustrating the second configuration example of the first semiconductor force sensor that is illustrated in FIG. 20A while omitting gate lines and signal lines;

FIG. 20C is a plan view illustrating the second configuration example of the first semiconductor force sensor that is illustrated in FIG. 20B while further omitting gate electrodes;

FIG. 21A is a plan view illustrating a third configuration example of the first semiconductor force sensor in the second embodiment;

FIG. 21B is a plan view illustrating the third configuration example of the first semiconductor force sensor that is illustrated in FIG. 21A while omitting the gate lines and the signal lines;

FIG. 21C is a plan view illustrating the third configuration example of the first semiconductor force sensor that is illustrated in FIG. 21B while further omitting the gate electrodes;

FIG. 21D is a plan view illustrating the third configuration example of the first semiconductor force sensor that is illustrated in FIG. 21B while further omitting the wiring lines;

FIG. 22C is a plan view illustrating the fourth configuration example of the first semiconductor force sensor that is illustrated in FIG. 22B while further omitting the gate electrodes;

DETAILED DESCRIPTION

Figure 1:
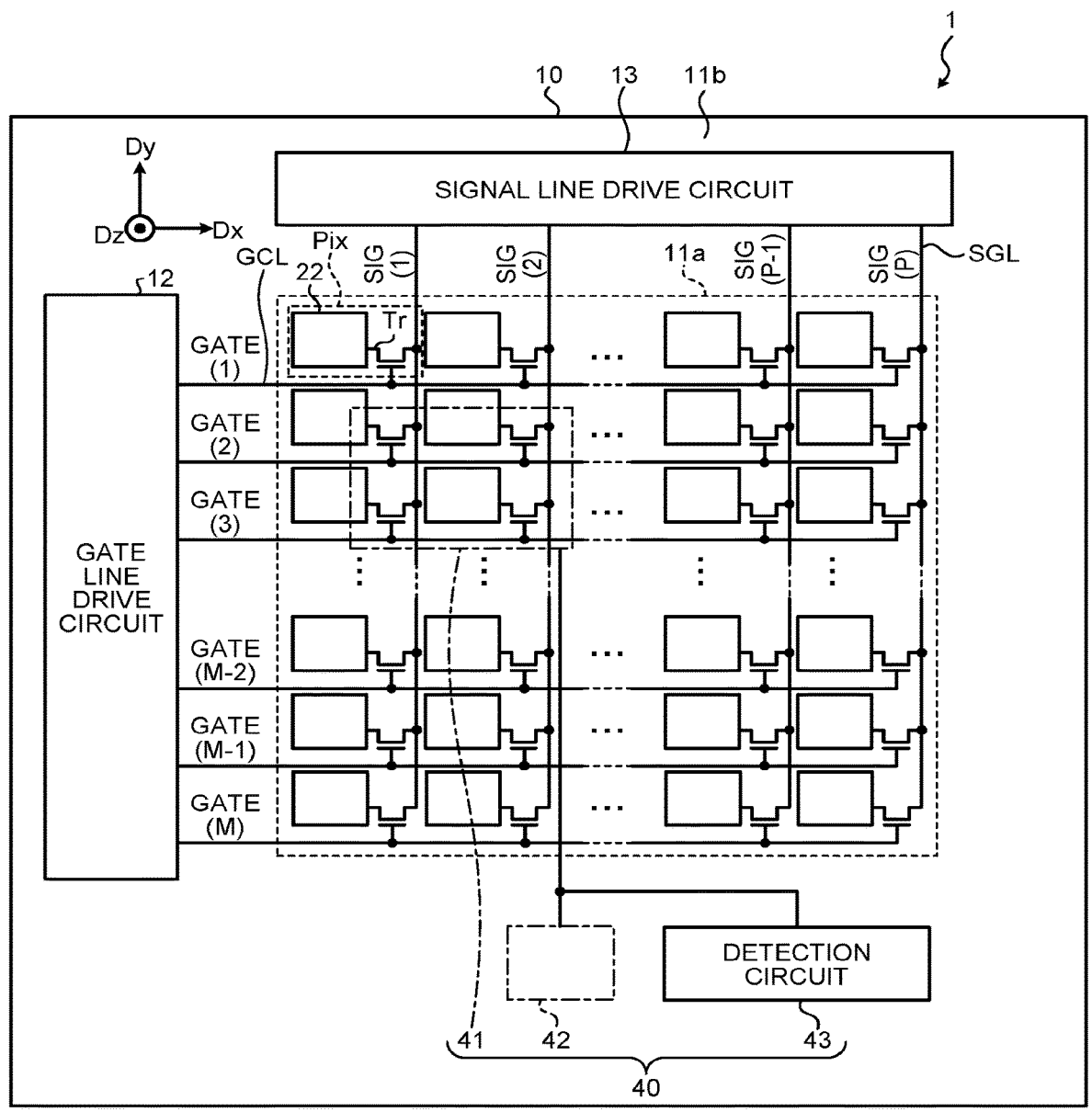
FIG. 1 is a block diagram illustrating an example of the configuration of a display device according to a first embodiment.

Modes for carrying out the present disclosure (embodiments) will be described in detail with reference to the drawings. Contents described in the following embodiments do not limit the present disclosure. Components described below include those that can be easily assumed by those skilled in the art and substantially the same components. Furthermore, the components described below can be appropriately combined. What is disclosed herein is merely an example, and it is needless to say that appropriate changes within the gist of the disclosure at which those skilled in the art can easily arrive are encompassed in the range of the present disclosure. In the drawings, widths, thicknesses, shapes, and the like of the components can be schematically illustrated in comparison with actual modes for more clear explanation. They are however merely examples and do not limit interpretation of the present disclosure. In the present specification and the drawings, the same reference numerals denote components similar to those described before with reference to the drawing that has been already referred, and detailed explanation thereof can be appropriately omitted.

In this disclosure, when an element is described as being "on" another element, the element can be directly on the other element, or there can be one or more elements between the element and the other element.

First Embodiment

FIG. 1 is a block diagram illustrating an example of the configuration of a display device according to a first embodiment. As illustrated in FIG. 1, a display device 1 includes, on a display panel 10, a display region 11a in which a plurality of pixels Pix are arrayed in a row direction (Dx direction) and a column direction (Dy direction), a gate line drive circuit 12, a signal line drive circuit 13, and a detection circuit 43. Although FIG. 1 illustrates some pixels Pix, the pixels Pix are arranged over the entire area of the display region 11a. Although the configuration using a liquid crystal display element as a display element is exemplified in the embodiment, the mode of the display element does not limit the present disclosure.

The display device 1 includes a first semiconductor force sensor 41 in the display region 11a for displaying an image. The display device 1 includes a second semiconductor force sensor 42 in a frame region 11b provided outside the display region 11a. An electrostatic capacitance-type touch sensor may be mounted on or be integrated with the display device 1.

Each pixel Pix includes a pixel electrode 22 and a pixel transistor Tr. The pixel transistor Tr is formed with a thin film transistor and is configured with, for example, an n-channel metal oxide semiconductor (MOS)-type TFT. The source of the pixel transistor Tr is coupled to a corresponding one of signal lines SGL, the gate thereof is coupled to a corresponding one of gate lines GCL, and the drain thereof is coupled to the pixel electrode 22.

The pixel Pix is coupled to the other pixels Pix aligned therewith in the row direction (Dx direction) by the gate line GCL. The gate lines GCL are coupled to the gate line drive circuit 12 and supplied with gate signals GATE (1, 2, . . . , and M) from the gate line drive circuit 12.

The pixel Pix is coupled to the other pixels Pix aligned therewith in the column direction (Dy direction) by the signal line SGL. The signal lines SGL are coupled to the signal line drive circuit 13 and supplied with pixel signals SIG (1, 2, . . . , and P) from the signal line drive circuit 13.

The gate line drive circuit 12 supplies the gate signals GATE (1, 2, . . . , and M) to the gates of the pixel transistors Tr of the pixels Pix of first, second, . . . , and Mth rows through the gate lines GCL.

The signal line drive circuit 13 supplies the pixel signals SIG (1, 2, . . . , and P) to the sources of the pixel transistors Tr of the pixels Pix through the signal lines SGL. The signal line drive circuit 13 supplies the pixel signals SIG (1, 2, . . . , and P) to the pixels Pix of the first, second, . . . , and Mth rows simultaneously.

The first semiconductor force sensor 41, the second semiconductor force sensor 42, and the detection circuit 43 are included in a force detector 40 that detects force applied to the display region 11a (display surface). The force detector 40 will be described later.

The gate line drive circuit 12, the signal line drive circuit 13, and the detection circuit 43 may be configured as individual devices (IC) or may be configured as one or a plurality of devices (ICs) having the above-mentioned functions integrated. A touch detection function may be further integrated therewith. The configurations of the gate line drive circuit 12, the signal line drive circuit 13, and the detection circuit 43 do not limit the present disclosure.

Figure 2:
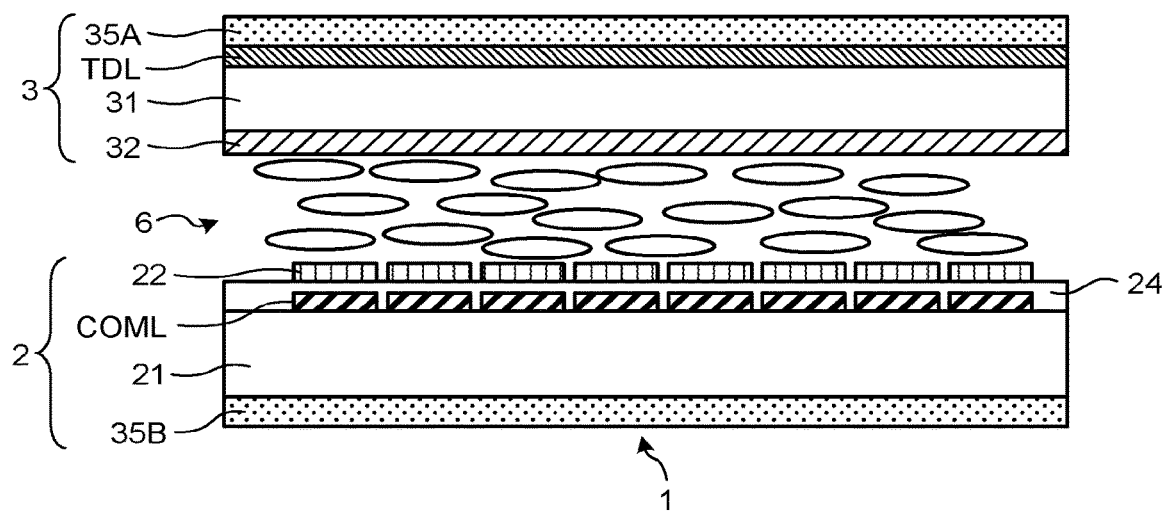
FIG. 2 is a sectional view illustrating the schematic sectional configuration of the display device.
Figure 3:
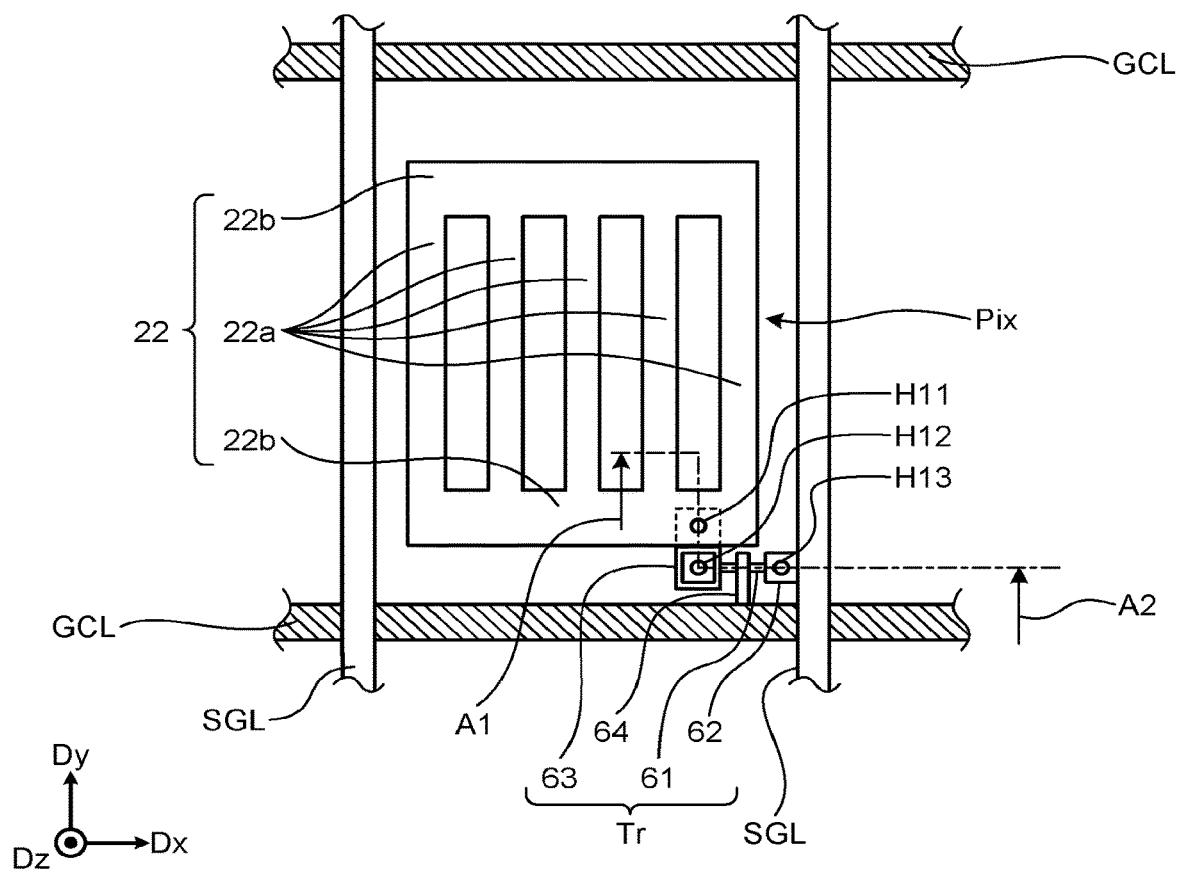
FIG. 3 is a plan view illustrating an example of the configuration of a pixel.

Next, the schematic configuration of the display device 1 in the embodiment will be described with reference to FIG. 2 to FIG. 4. FIG. 2 is a sectional view illustrating the schematic sectional configuration of the display device. FIG. 3 is a plan view illustrating an example of the configuration of the pixel. FIG. 4 is a sectional view cut along line A1-A2 in FIG. 3.

As illustrated in FIG. 2, the display device 1 includes a pixel substrate 2, a counter substrate 3 arranged so as to face the surface of the pixel substrate 2 in the perpendicular direction, and a liquid crystal layer 6 inserted between the pixel substrate 2 and the counter substrate 3.

As illustrated in FIG. 2, the pixel substrate 2 includes a thin film transistor (TFT) substrate 21 as a circuit board, the pixel electrodes 22, drive electrodes COML supplying a reference potential VCOM to the pixel electrodes 22, and an insulating layer 24 insulating the pixel electrodes 22 and the drive electrodes COML. The pixel electrodes 22 are arrayed in a matrix with a row-column configuration, for example, above the TFT substrate 21. The drive electrodes COML are provided between the TFT substrate 21 and the pixel electrodes 22. A polarizing plate 35B is provided under the TFT substrate 21 with an adhesion layer (not illustrated) therebetween. In the present specification, the direction toward a counter substrate 31 from the TFT substrate 21 in the direction perpendicular to the TFT substrate 21 is an "upward direction". The direction toward the TFT substrate 21 from the counter substrate 31 is a "downward direction".

The drive electrodes COML are provided in the display region 11a of the TFT substrate 21. The drive electrodes COML are made of, for example, a conductive material having translucency, such as indium tin oxide (ITO).

The counter substrate 3 includes the counter substrate 31 and a color filter 32 formed on one surface of the counter substrate 31. FIG. 2 illustrates an example in which a touch detection electrode TDL is provided on the other surface of the counter substrate 31. A polarizing plate 35A is provided above the touch detection electrode TDL with an adhesion layer (not illustrated) therebetween.

The TFT substrate 21 and the counter substrate 31 are arranged so as to face each other with a predetermined gap therebetween. The liquid crystal layer 6 as a display function layer is provided in a space between the TFT substrate 21 and the counter substrate 31. The liquid crystal layer 6 modulates light that passes therethrough in accordance with an electric field state, and, for example, liquid crystal in a transverse electric field mode such as in-plane switching (IPS) including fringe field switching (FFS) is used therefor. Orientation films may be respectively arranged between the liquid crystal layer 6 and the pixel substrate 2 and between the liquid crystal layer 6 and the counter substrate 3.

The pixel transistors Tr of the pixels Pix, the signal lines SGL supplying the pixel signals SIG to the pixel electrodes 22, the gate lines GCL supplying the drive signals driving the pixel transistors Tr, and other wiring lines are formed on the TFT substrate 21. The signal lines SGL and the gate lines GCL extend in a plane parallel to the surface of the TFT substrate 21.

As illustrated in FIG. 3, a region surrounded by the gate lines GCL and the signal lines SGL is the pixel Pix. The pixel Pix includes a region in which the pixel electrode 22 and the drive electrode COML overlap with each other. The pixel electrodes 22 are coupled to the signal lines SGL through the pixel transistors Tr.

As illustrated in FIG. 3, each pixel electrode 22 has a plurality of band-like electrodes 22a and connection portions 22b. The band-like electrodes 22a are provided along the signal lines SGL and are aligned in the direction along the gate lines GCL. The connection portions 22b connect end portions of the band-like electrodes 22a. Although the pixel electrode 22 has five band-like electrodes 22a, the number thereof is not limited thereto and the pixel electrode 22 may have four or less or six or more band-like electrodes 22a. The pixel electrode 22 may have two band-like electrodes 22a, for example.

As illustrated in FIG. 3, each pixel transistor Tr includes a semiconductor layer 61, a source electrode 62, a drain electrode 63, and a gate electrode 64. A light shielding layer 65 is provided under the semiconductor layer 61.

As illustrated in FIG. 4, the light shielding layer 65 is provided on the upper side of a substrate 121. An insulating layer 58a covers the light shielding layer 65 and is provided on the upper side of the substrate 121. The semiconductor layer 61 is provided on the upper side of the insulating layer 58a. The gate electrode 64 (gate line GCL) is provided above the semiconductor layer 61 with an insulating layer 58b therebetween. The drain electrode 63 and the source electrode 62 (signal line SGL) are provided above the gate electrode 64 (gate line GCL) with an insulating layer 58c therebetween. The drive electrodes COML are provided above the drain electrode 63 and the source electrode 62 (signal line SGL) with an insulating layer 58d and an insulating layer 58e therebetween. The pixel electrode 22 is provided above the common electrodes COML with the insulating layer 24 therebetween. An orientation film 34 is provided on the upper side of the pixel electrode 22. An orientation film 33 faces the orientation film 34 with the liquid crystal layer 6 interposed therebetween. Wiring lines 44, 45, 46, 47, and 48, which will be described later, are provided on the insulating layer 58d.

As illustrated in FIG. 3 and FIG. 4, the pixel electrode 22 is coupled to the drain electrode 63 of the pixel transistor Tr through a contact hole H11. The semiconductor layer 61 is coupled to the drain electrode 63 through a contact hole H12. The semiconductor layer 61 intersects with the gate electrode 64 when seen from above. The gate electrode 64 is coupled to the gate line GCL and is provided so as to project from one side of the gate line GCL. The semiconductor layer 61 extends to a position overlapping with the source electrode 62 and is electrically coupled to the source electrode 62 through a contact hole H13. The source electrode 62 is coupled to the signal line SGL and projects from one side of the signal line SGL.

A well-known material such as polysilicon and oxide semiconductor can be used as a material of the semiconductor layers 61. For example, usage of transparent amorphous oxide semiconductor (TAOS) can achieve excellent ability to retain a voltage for video image display for a long period of time (retention rate) and improve display quality.

Well-known insulating materials can be used as materials of the insulating layers 24, 58a, 58b, 58c, 58d, and 58e. For example, tetra ethyl ortho silicate (TEOS) can be used as the material of the insulating layer 58b. For example, a silicon oxide film ($SiO_2$) can be used as the material of the insulating layer 58c.

A channel portion (not illustrated) is provided in a portion of the semiconductor layer 61 that overlaps with the gate electrode 64. The light shielding layer 65 is provided at a position overlapping with the channel portion and preferably has a larger area than that of the channel portion. The light shielding layer 65 is provided to thereby block light that would be incident on the semiconductor layer 61 from the backlight, for example.

Figure 5A:
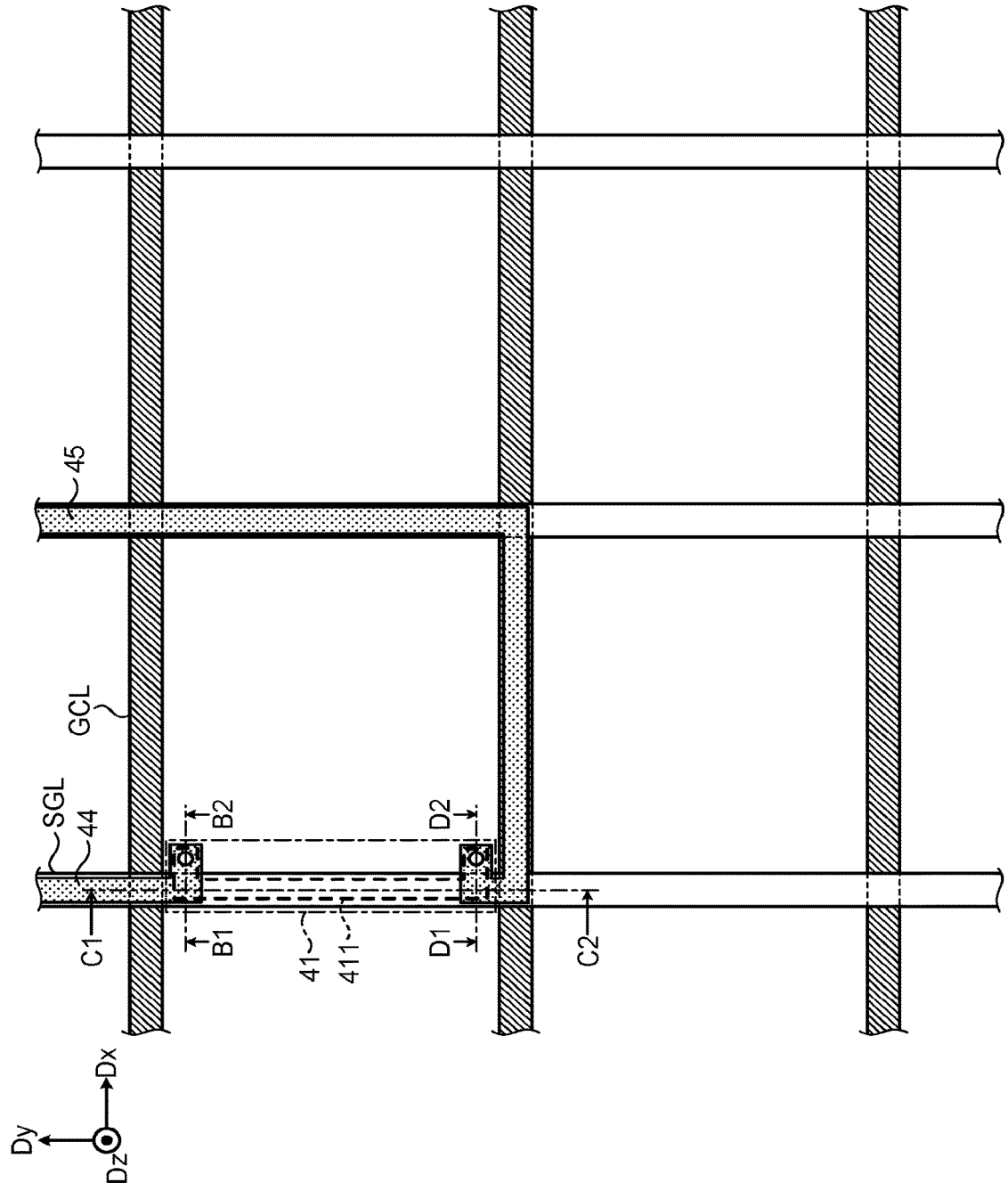
FIG. 5A is a plan view illustrating a first configuration example of a first semiconductor force sensor in the first embodiment.
Figure 5B:
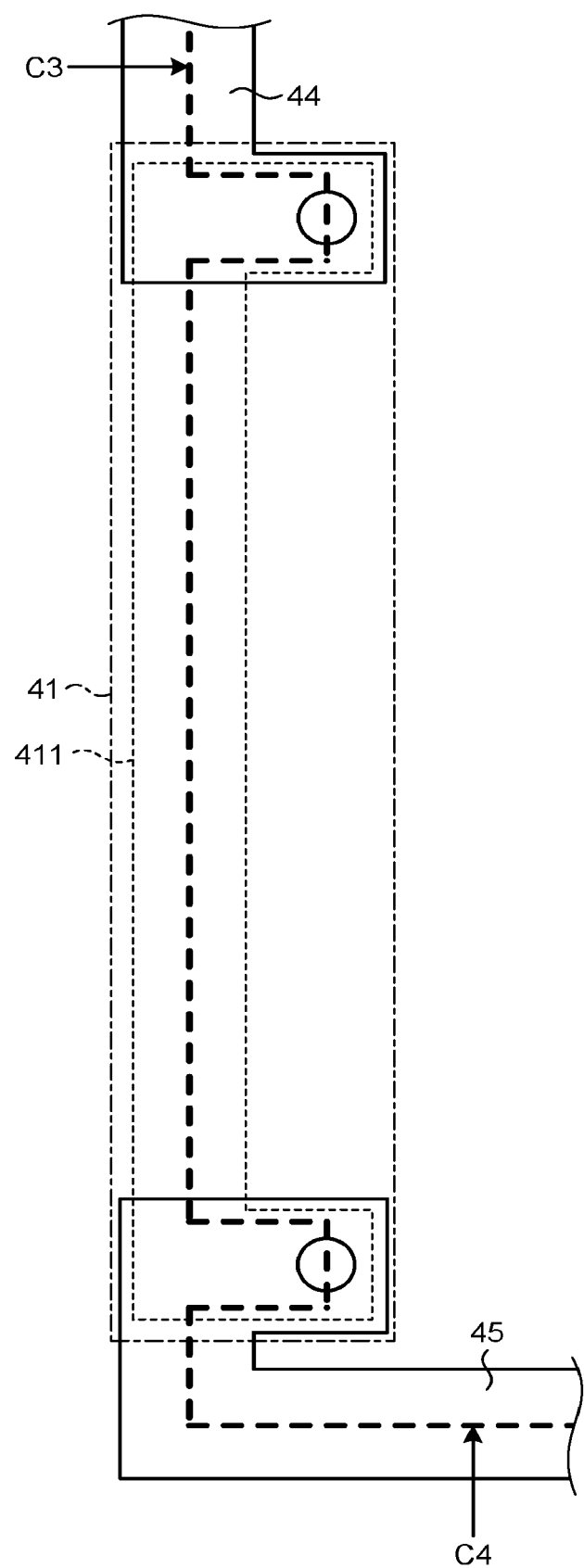
FIG. 5B is an enlarged view of the first semiconductor force sensor illustrated in FIG. 5A.
Figure 5C:
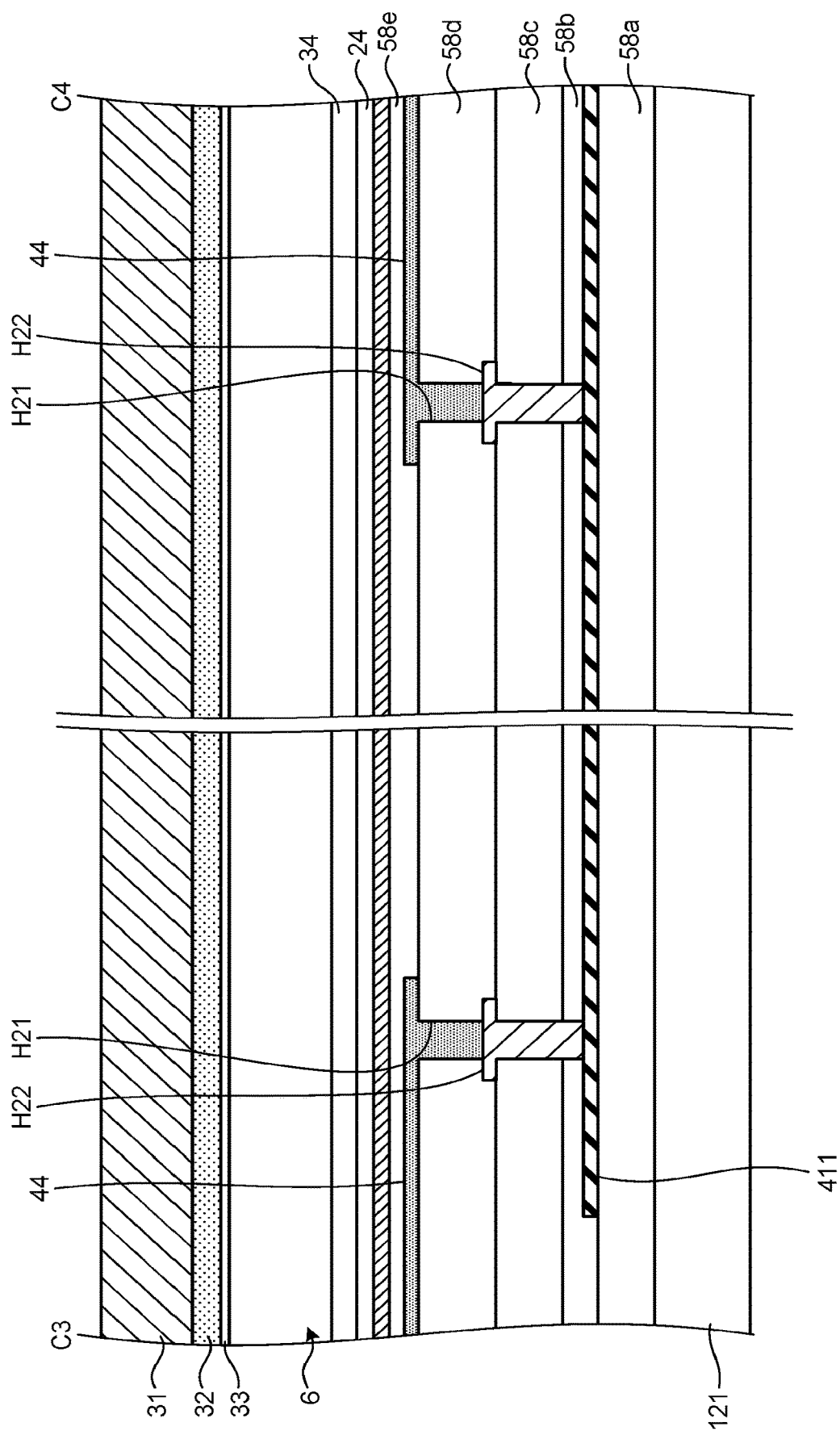
FIG. 5C is a sectional view cut along line C3-C4 in FIG. 5A.
Figure 8:
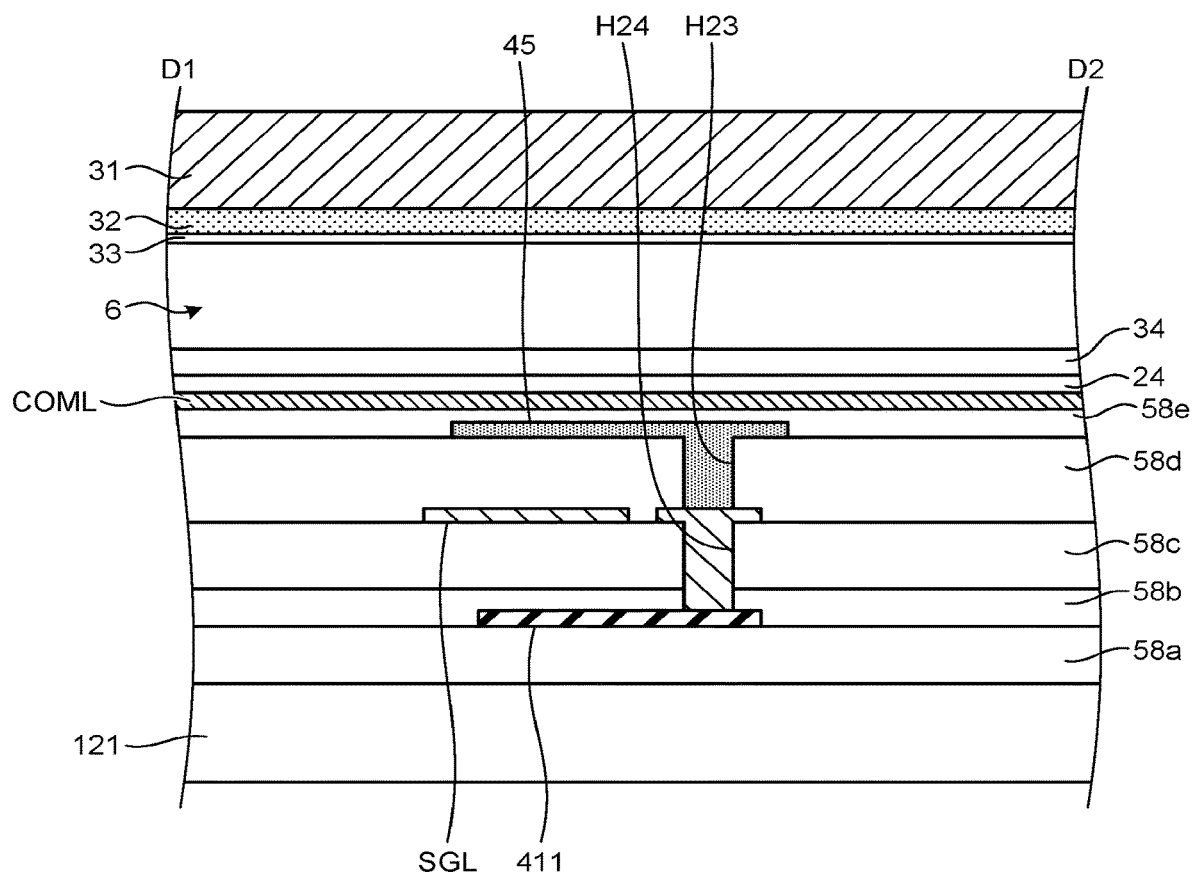
FIG. 8 is a sectional view cut along line D1-D2 in FIG. 5A.

FIG. 5A is a plan view illustrating a first configuration example of the first semiconductor force sensor in the first embodiment. FIG. 5B is an enlarged view of the first semiconductor force sensor illustrated in FIG. 5A. FIG. 5C is a sectional view cut along line C3-C4 in FIG. 5A. FIG. 5B and FIG. 5C omit illustration of the gate lines GCL and the signal lines SGL in order to make a coupling relation between the wiring line 44 provided on the insulating layer 58*d*, a semiconductor resistor element 411, and the wiring line 45 provided on the insulating layer 58*d* easy to view. FIG. 6 is a sectional view cut along line B1-B2 in FIG. 5A. FIG. 7 is a sectional view cut along line C1-C2 in FIG. 5A. FIG. 8 is a sectional view cut along line D1-D2 in FIG. 5A. FIG. 5A to FIG. 8 omit components of the pixels Pix illustrated in FIG. 3.

As illustrated in FIG. 5A to FIG. 8, the first semiconductor force sensor 41 includes the semiconductor resistor element 411 provided in the same layer as the semiconductor layers 61. The "same layer" in the specification is a layer formed by the same process and made of the same material.

The semiconductor resistor element 411 is provided in the same layer as the semiconductor layers 61 in the display region 11*a*. The semiconductor resistor element 411 overlaps with the signal line SGL provided on the insulating layer 58*c* and extends in the column direction. One end of the semiconductor resistor element 411 is coupled to the wiring line 44 provided on the insulating layer 58*d* through a contact hole H21 and a contact hole H22, as illustrated in FIG. 6. The other end of the semiconductor resistor element 411 is coupled to the wiring line 45 provided on the insulating layer 58*d* through a contact hole H23 and a contact hole H24, as illustrated in FIG. 8.

Although FIG. 5A illustrates an example in which the wiring line 44 and the wiring line 45 are extended to the upper side in the drawing, the extension directions of the wiring line 44 and the wiring line 45 are not limited thereto.

Figure 9:
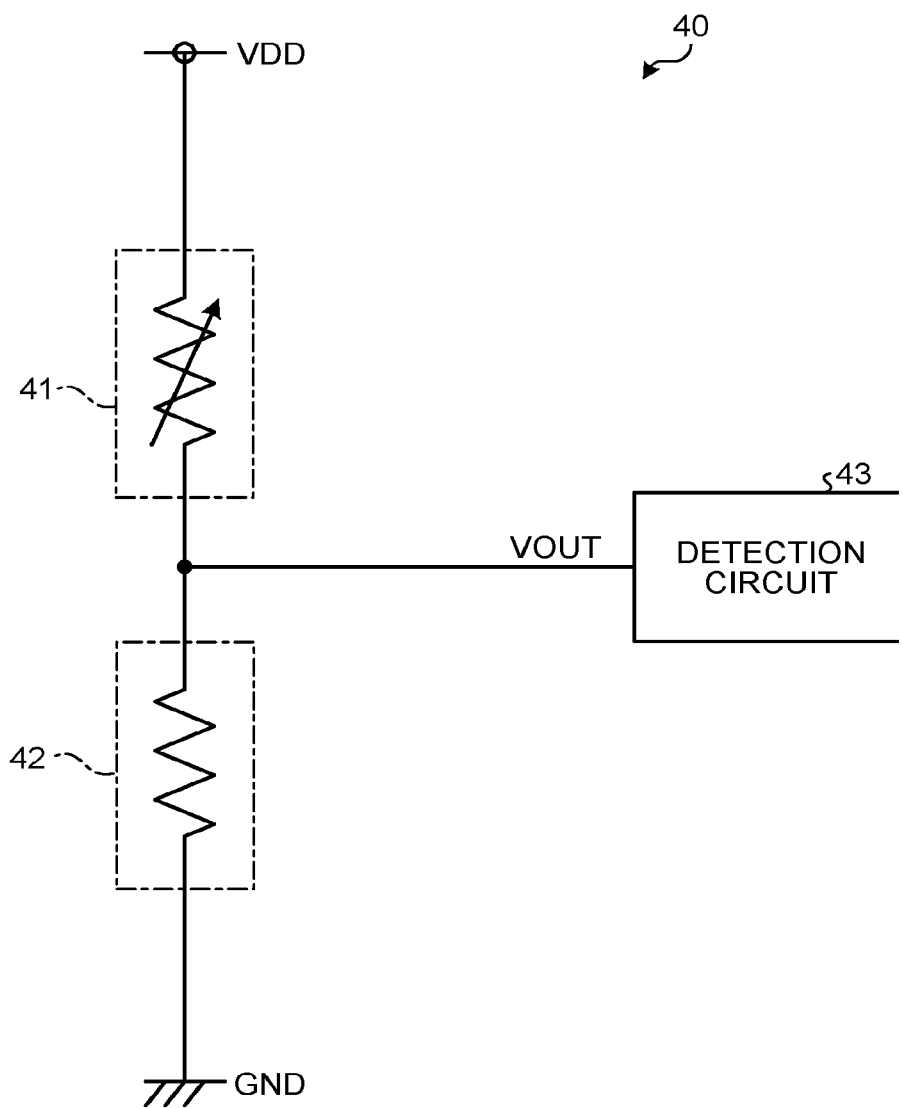
FIG. 9 is an equivalent circuit diagram illustrating a first configuration example of a force detector in the first embodiment.

FIG. 9 is an equivalent circuit diagram illustrating a first configuration example of the force detector in the first embodiment. FIG. 9 illustrates the first configuration example of the force detector 40 in the first embodiment in which the first semiconductor force sensor 41 and the second semiconductor force sensor 42 are coupled in series between a positive power supply potential VDD and a ground potential GND and a middle-point voltage VOUT is output to the detection circuit 43.

The detection circuit 43 detects force applied to the display region 11*a* based on the middle-point voltage VOUT between the first semiconductor force sensor 41 and the second semiconductor force sensor 42 in the mode illustrated in FIG. 9.

The semiconductor resistor element 411 of the first semiconductor force sensor 41 can be regarded as a variable resistor the resistance value of which is changed with the force applied to the display region 11*a*.

The second semiconductor force sensor 42 has electric characteristics equivalent to those of the first semiconductor force sensor 41. That is to say, the second semiconductor force sensor 42 includes a semiconductor resistor element provided in the same layer as the semiconductor layers 61 in the frame region 11*b*, and a resistance value of the semiconductor resistor element is equivalent to the resistance value of the semiconductor resistor element 411 of the first semiconductor force sensor 41 when no force is applied to the display region 11*a*. The second semiconductor force sensor 42 has a layer structure, including the semiconductor resistor element, that is equivalent to that of the first semiconductor force sensor 41 illustrated in FIG. 5A to FIG. 8. The second semiconductor force sensor 42 thereby functions as a reference for change in the resistance value of the semiconductor resistor element 411 of the first semiconductor force sensor 41.

Figure 10:
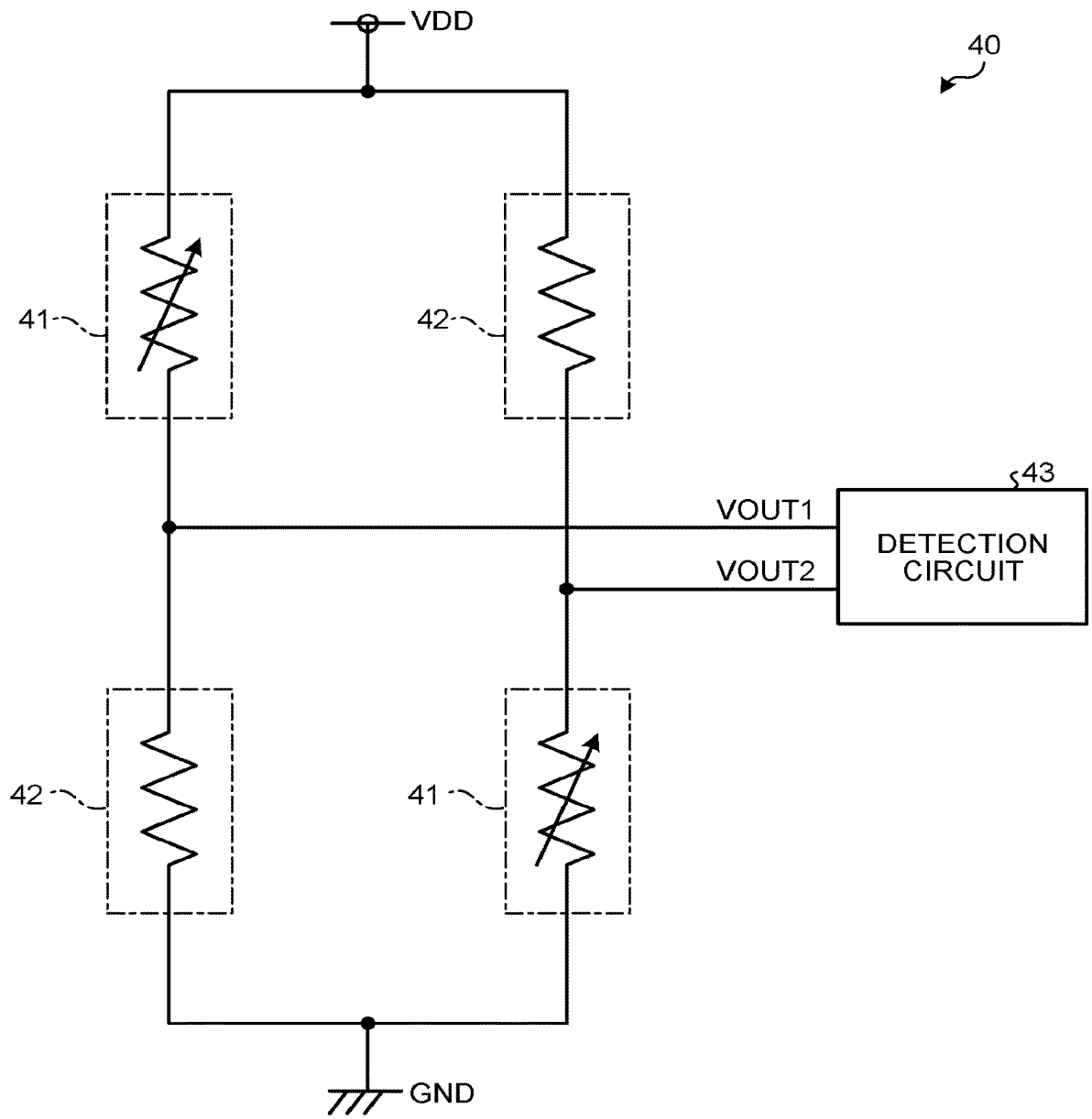
FIG. 10 is an equivalent circuit diagram illustrating a second configuration example of the force detector in the first embodiment.

FIG. 10 is an equivalent circuit diagram illustrating a second configuration example of the force detector in the first embodiment. FIG. 10 illustrates the second configuration example of the force detector 40 in the first embodiment in which two first semiconductor force sensors 41 and two second semiconductor force sensors 42 configure a Wheatstone bridge circuit between the positive power supply potential VDD and the ground potential GND in.

The detection circuit 43 detects force applied to the display region 11*a* based on output voltages VOUT1 and VOUT2 of the Wheatstone bridge circuit in the mode illustrated in FIG. 10.

The configuration of the Wheatstone bridge circuit provides a potential difference between the output voltages VOUT1 and VOUT2 as a value obtained by canceling influences caused by temperature change. With this configuration, the force applied to the display region 11*a* can be detected with higher accuracy than the mode illustrated in FIG. 9.

Figure 11:
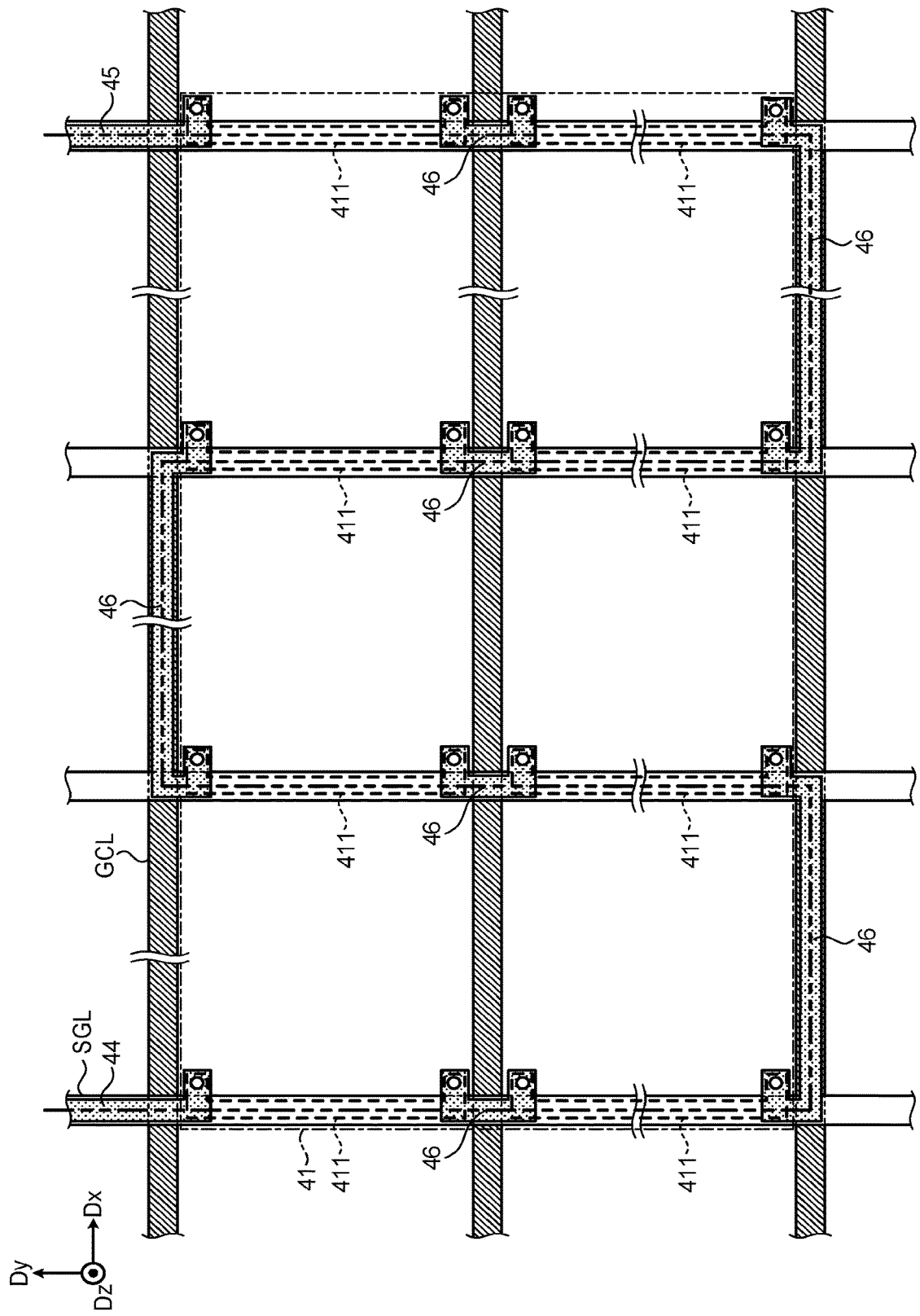
FIG. 11 is a plan view illustrating a second configuration example of the first semiconductor force sensor in the first embodiment.

FIG. 11 is a plan view illustrating a second configuration example of the first semiconductor force sensor in the first embodiment.

The second configuration example illustrated in FIG. 11 is different from the first configuration example illustrated in FIGS. 5A to 5C in the point that the semiconductor resistor elements 411 are coupled in series to form the first semiconductor force sensor 41. The semiconductor resistor elements 411 are coupled to each other by the wiring lines 46 provided on the insulating layer 58*d* through contact holes. A plurality of columns of the semiconductor resistor elements 411 extending in the column direction (Dy direction) are included in the second configuration example illustrated in FIG. 11. FIG. 11 illustrates an example in which the first semiconductor force sensor 41 is configured by coupling the wiring line 44 provided on the insulating layer 58*d*, the semiconductor resistor element 411, the wiring line 46 provided on the insulating layer 58*d*, the semiconductor resistor element 411, the wiring line 46, the semiconductor resistor element 411, . . . , the wiring line 46, the semiconductor resistor element 411, and the wiring line 45 provided on the insulating layer 58*d* in this order as indicated by a chain double-dashed line in the drawing.

Figure 12:
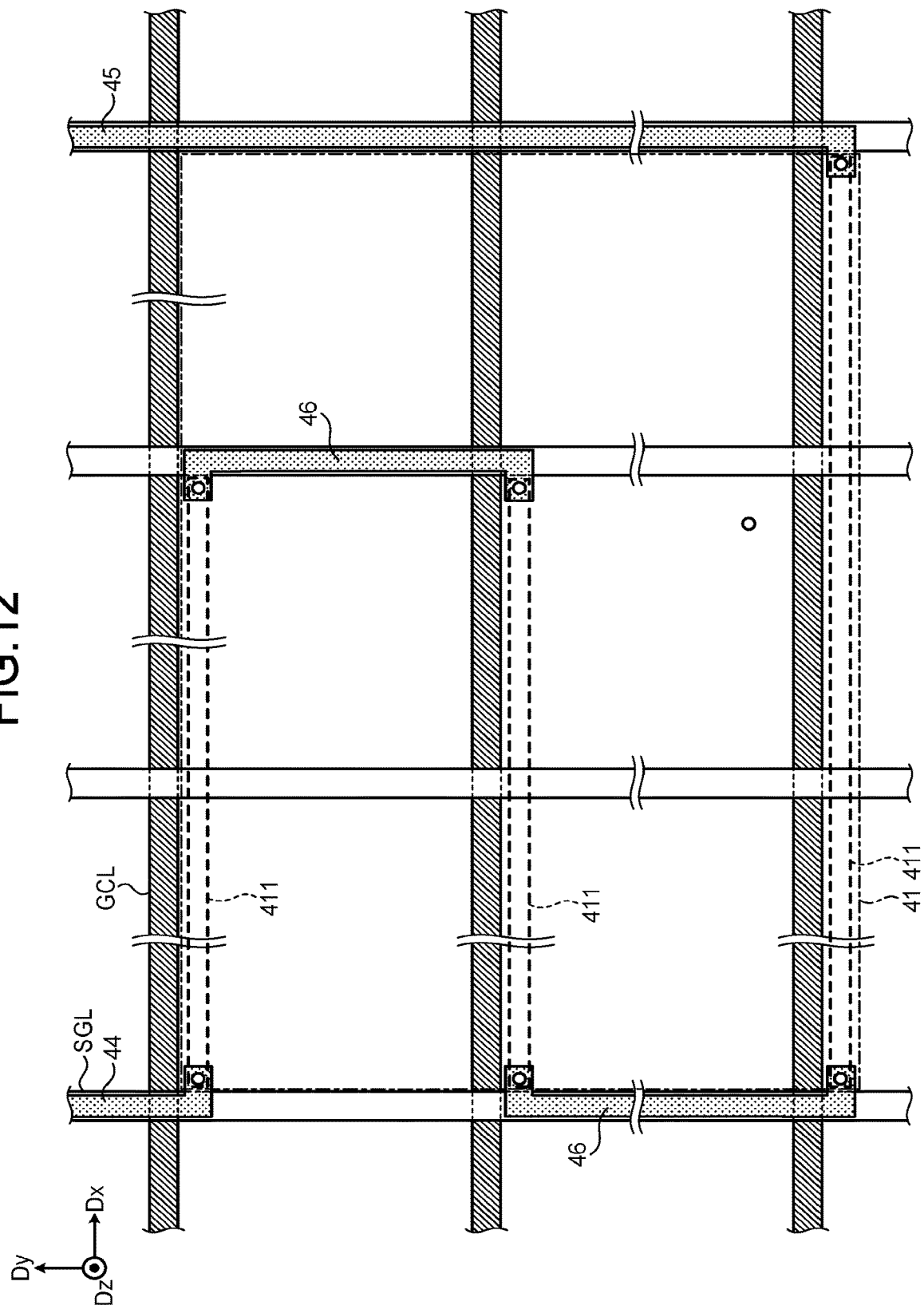
FIG. 12 is a plan view illustrating a third configuration example of the first semiconductor force sensor in the first embodiment.

FIG. 12 is a plan view illustrating a third configuration example of the first semiconductor force sensor in the first embodiment.

The third configuration example illustrated in FIG. 12 is different from the second configuration example illustrated in FIG. 11 in the point that the semiconductor resistor elements 411 extend in the row direction along the gate lines GCL. A plurality of rows of the semiconductor resistor elements 411 extending in the row direction (Dx direction) are included in the third configuration example illustrated in FIG. 12. When the semiconductor resistor elements 411 overlap with the gate lines GCL, voltage application to the gate lines GCL can change resistance values of the semiconductor resistor elements 411 to cause erroneous detection. It is therefore preferable that the semiconductor resistor elements 411 do not overlap with the gate lines GCL.

Figure 13:
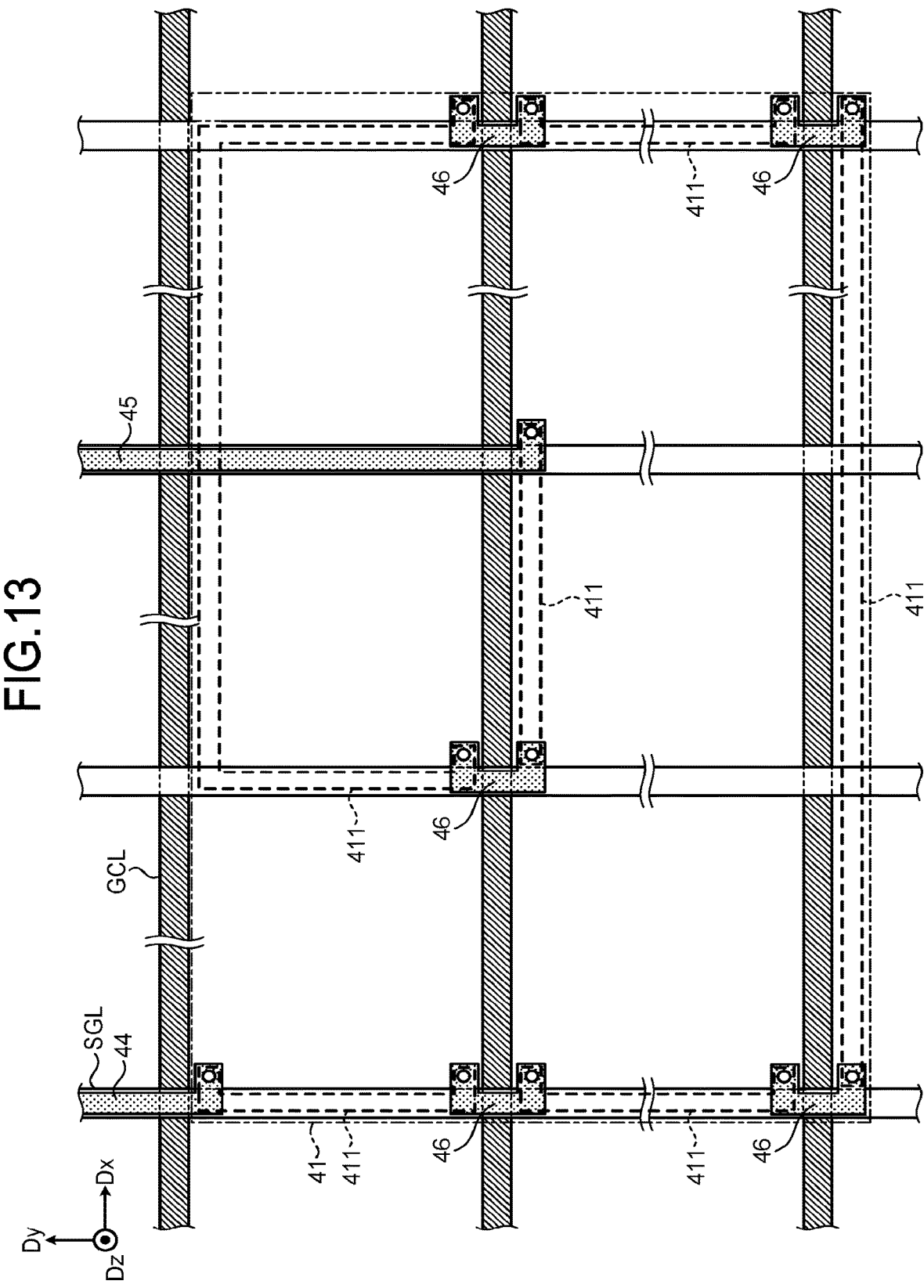
FIG. 13 is a plan view illustrating a fourth configuration example of the first semiconductor force sensor in the first embodiment.

FIG. 13 is a plan view illustrating a fourth configuration example of the first semiconductor force sensor in the first embodiment.

The fourth configuration example illustrated in FIG. 13 is a combination of the second configuration example illustrated in FIG. 11 and the third configuration example illustrated in FIG. 12 and includes both the semiconductor resistor elements 411 extending in the column direction (Dy direction) and the semiconductor resistor elements 411 extending in the row direction (Dx direction). FIG. 13 illustrates an example in which the semiconductor resistor elements 411 are arranged in a spiral form.

The resistance value of the first semiconductor force sensor 41 in each of the configuration examples illustrated in FIG. 11 to FIG. 13 can be made larger than that in the first configuration example illustrated in FIGS. 5A to 5C. Increase in the resistance values of the first semiconductor force sensor 41 and the second semiconductor force sensor 42 increases the amount of variation in the resistance value caused by the force applied to the display region 11a, thereby enhancing the detection accuracy of the force applied to the display region 11a.

The arrangement place of the first semiconductor force sensor 41 in the display region 11a does not limit the present disclosure. The first semiconductor force sensors 41 may be arranged at a plurality of places in the display region 11a. In this case, it is sufficient that the second semiconductor force sensors 42 are respectively provided for the first semiconductor force sensors 41. For example, when the two first semiconductor force sensors 41 and the two second semiconductor force sensors 42 configure the Wheatstone bridge circuit illustrated in FIG. 10, it is desired that the two first semiconductor force sensors 41 are arranged so as to be adjacent to each other. With this arrangement, the resistance values of the two first semiconductor force sensors 41 can be made substantially equal to each other when force is applied to the display region 11a.

As described above, the display device 1 in the first embodiment includes the display region 11a in which the pixels Pix are arrayed in the row direction (Dx direction) and the column direction (Dy direction), the gate lines GCL supplying the scan signals to the pixels Pix aligned in the row direction (Dx direction), the signal lines SGL supplying the pixel signals SIG to the pixels Pix aligned in the column direction (Dy direction), at least one first semiconductor force sensor 41 provided in the display region 11a, at least one second semiconductor force sensor 42 provided in the frame region 11b outside the display region 11a, and the detection circuit 43 that detects the force applied to the display region 11a based on the middle-point voltage between the first semiconductor force sensor 41 and the second semiconductor force sensor 42.

In the above-mentioned configuration, the configuration detecting the force applied to the display region 11a can be provided at low cost by providing the semiconductor resistor element 411 in the same layer as the semiconductor layers 61 of the pixel transistors Tr.

An aperture ratio of the pixels Pix can be hampered from being lowered by providing the semiconductor resistor element 411 so as to overlap with the signal line SGL and extend in the column direction.

The aperture ratio of the pixels Pix can be hampered from being lowered by providing the semiconductor resistor element 411 so as to extend in the row direction along the gate line GCL.

The resistance value of the first semiconductor force sensor 41 can be made larger than that in the first configuration example illustrated in FIGS. 5A to 5C by coupling the semiconductor resistor elements 411 in series by the wiring lines 46 provided on the insulating layer 58d to form the first semiconductor force sensor 41. With this configuration, the detection accuracy of the force applied to the display region 11a can be enhanced.

The embodiment can provide the configuration detecting the force applied to the display region at low cost.

Second Embodiment

Figure 14:
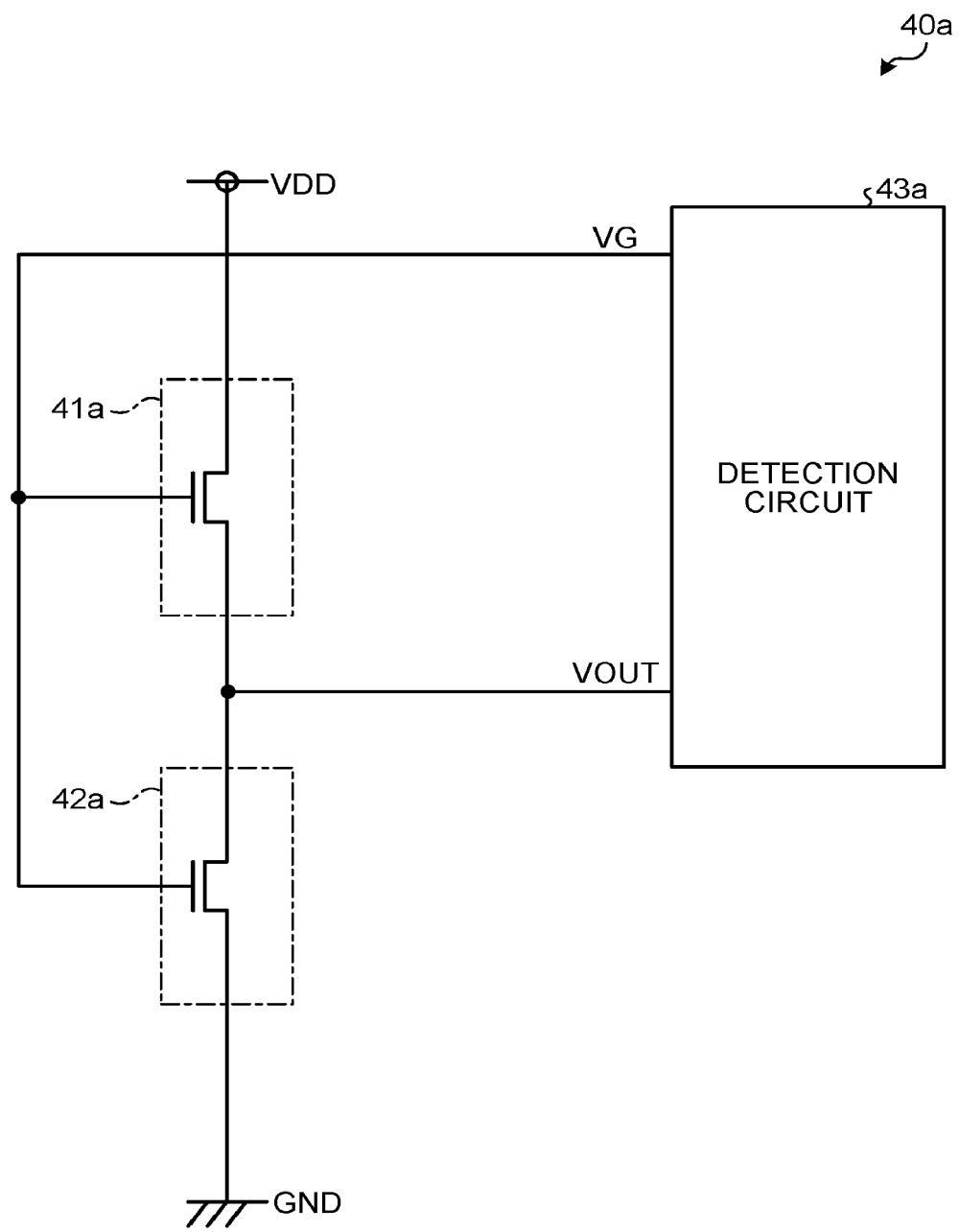
FIG. 14 is a block diagram illustrating a first configuration example of a force detector according to a second embodiment.
Figure 15:
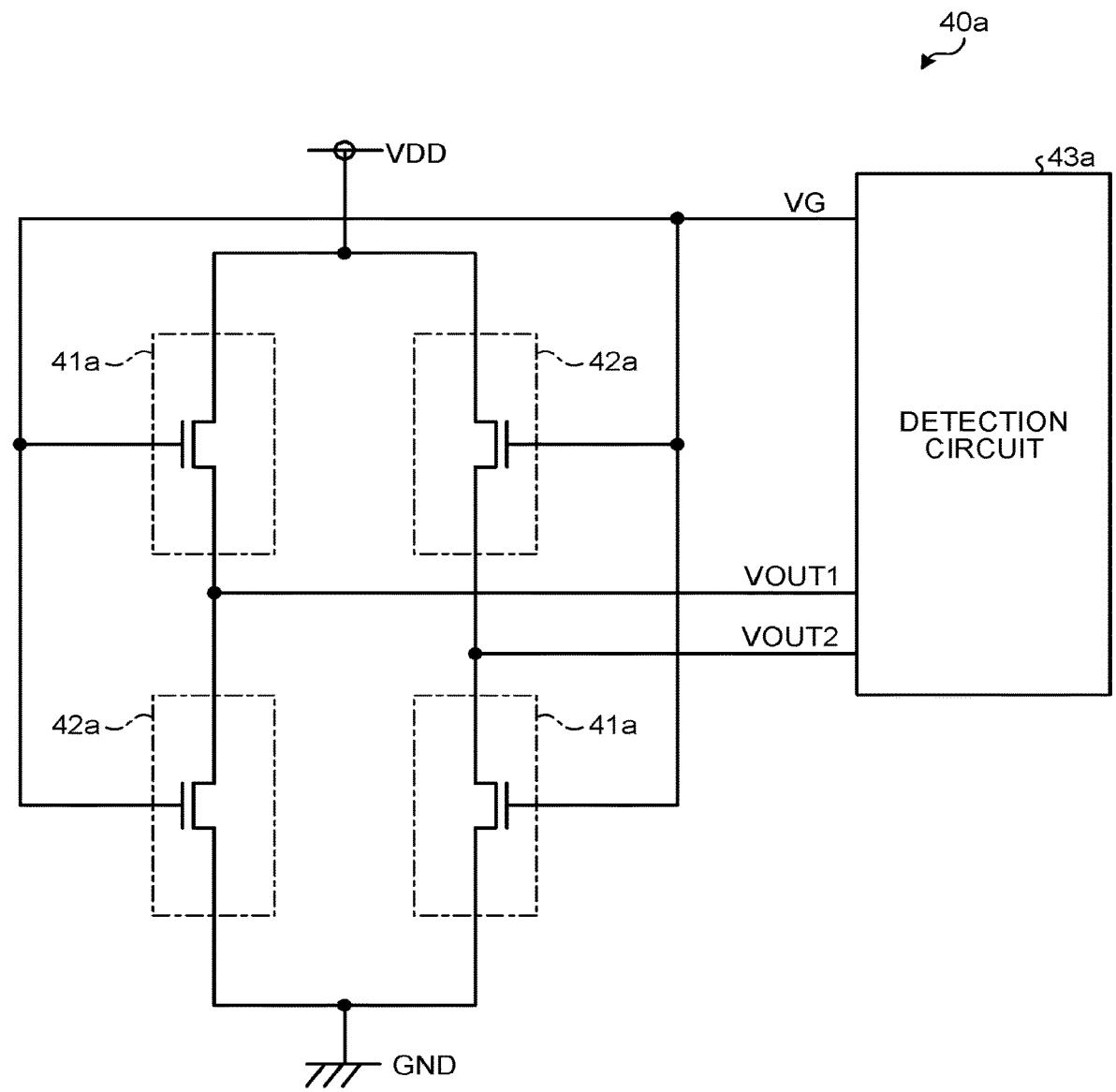
FIG. 15 is a block diagram illustrating a second configuration example of the force detector in the second embodiment.
Figure 16B:
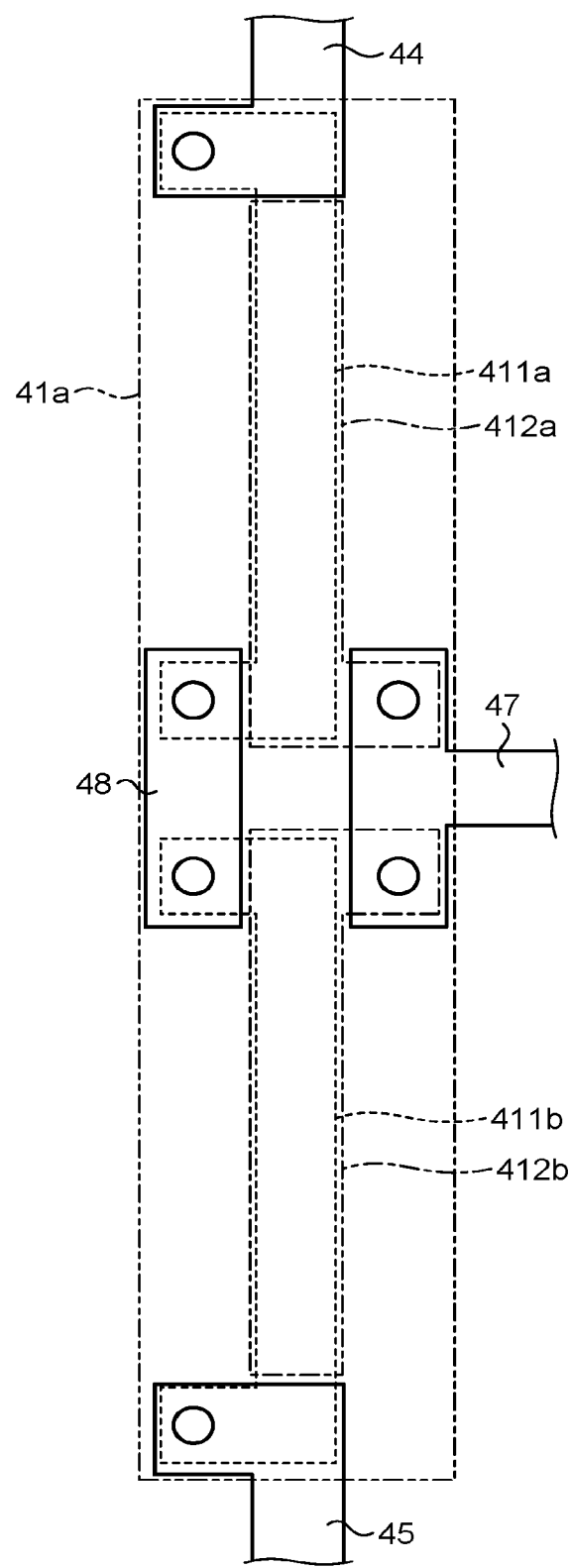
FIG. 16B is an enlarged view of the first semiconductor force sensor illustrated in FIG. 16A.
Figure 16C:
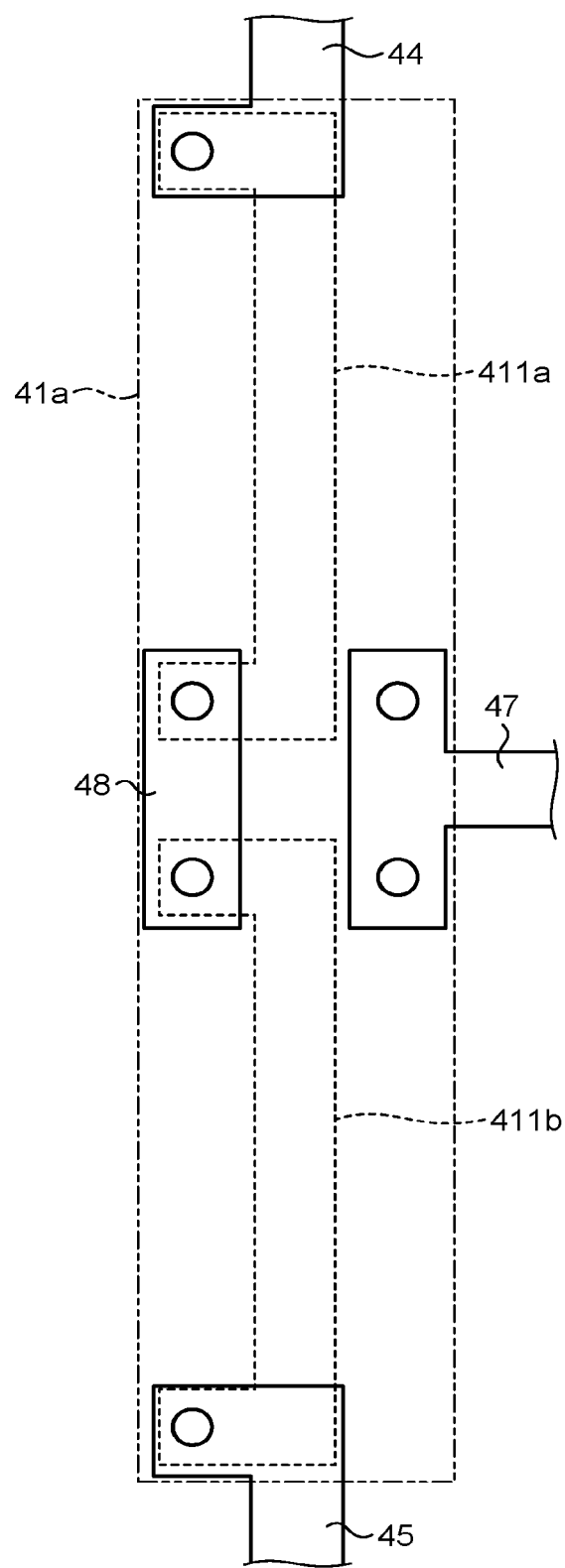
FIG. 16C is an enlarged view of the first semiconductor force sensor that is illustrated in FIG. 16B while omitting gate electrodes.
Figure 16D:
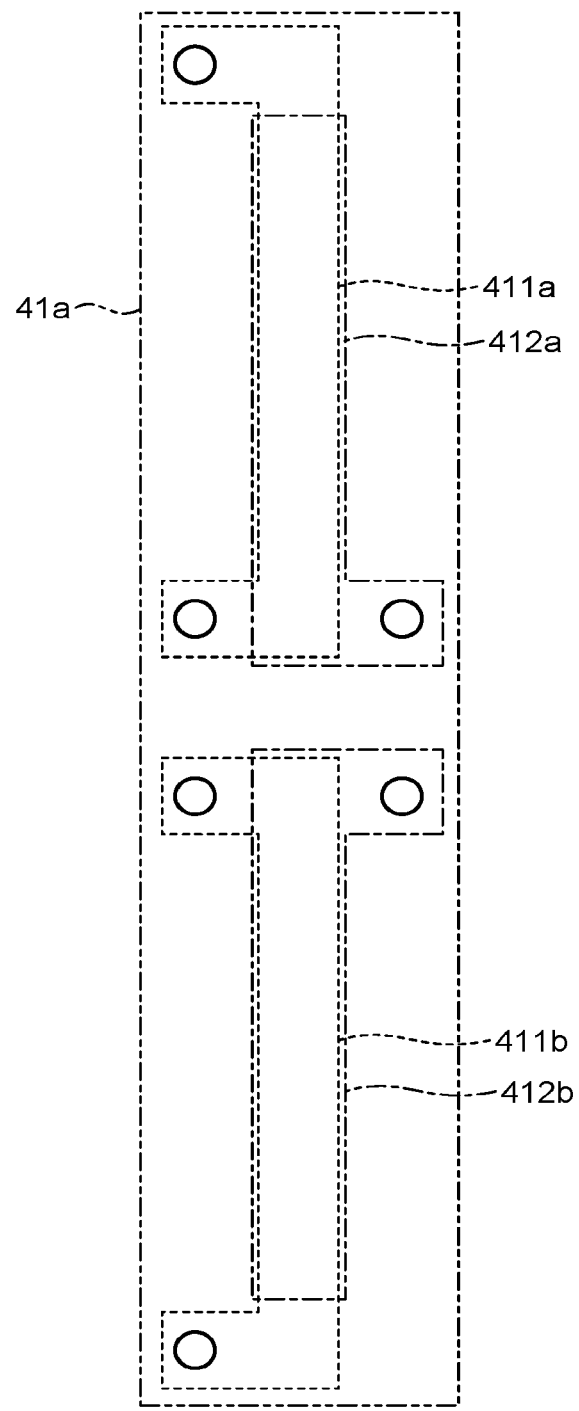
FIG. 16D is an enlarged view of the first semiconductor force sensor that is illustrated in FIG. 16B while omitting wiring lines.
Figure 17:
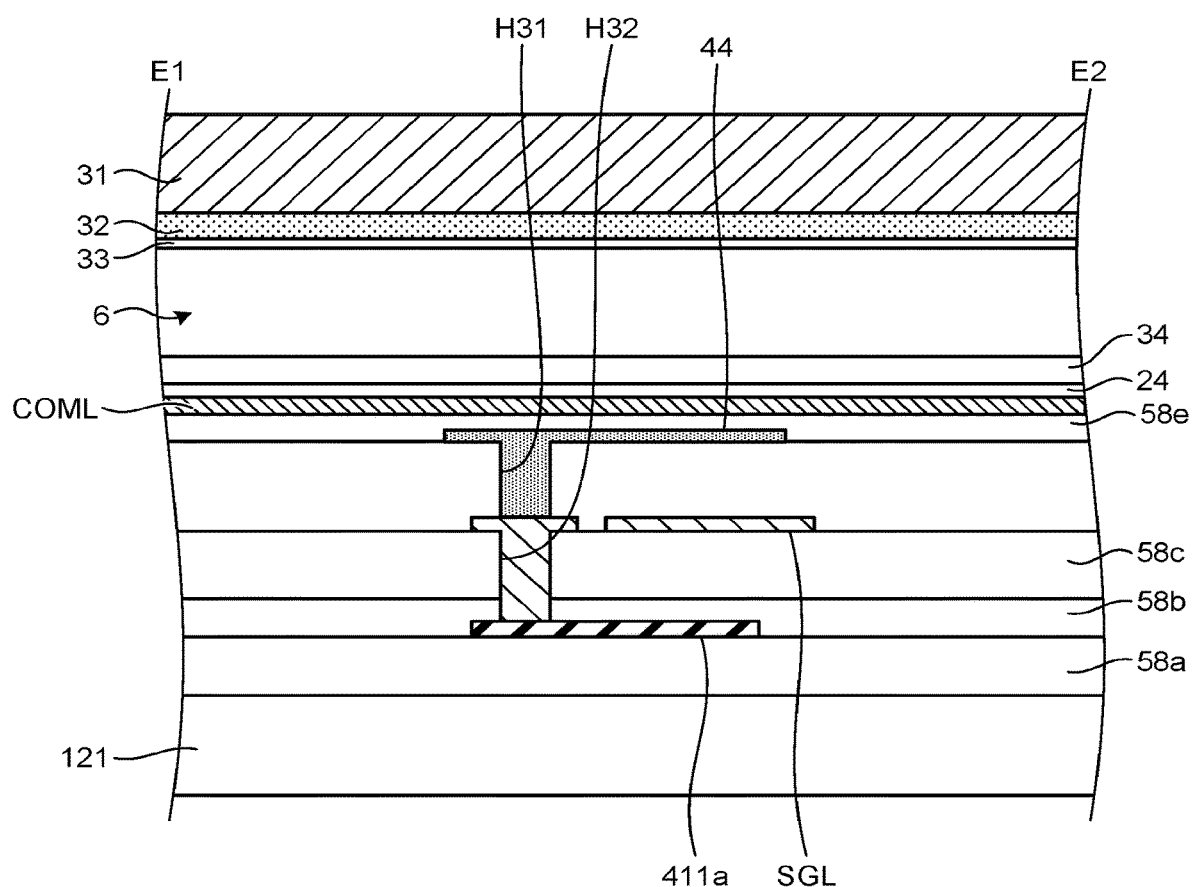
FIG. 17 is a sectional view cut along line E1-E2 in FIG. 16A.
Figure 18:
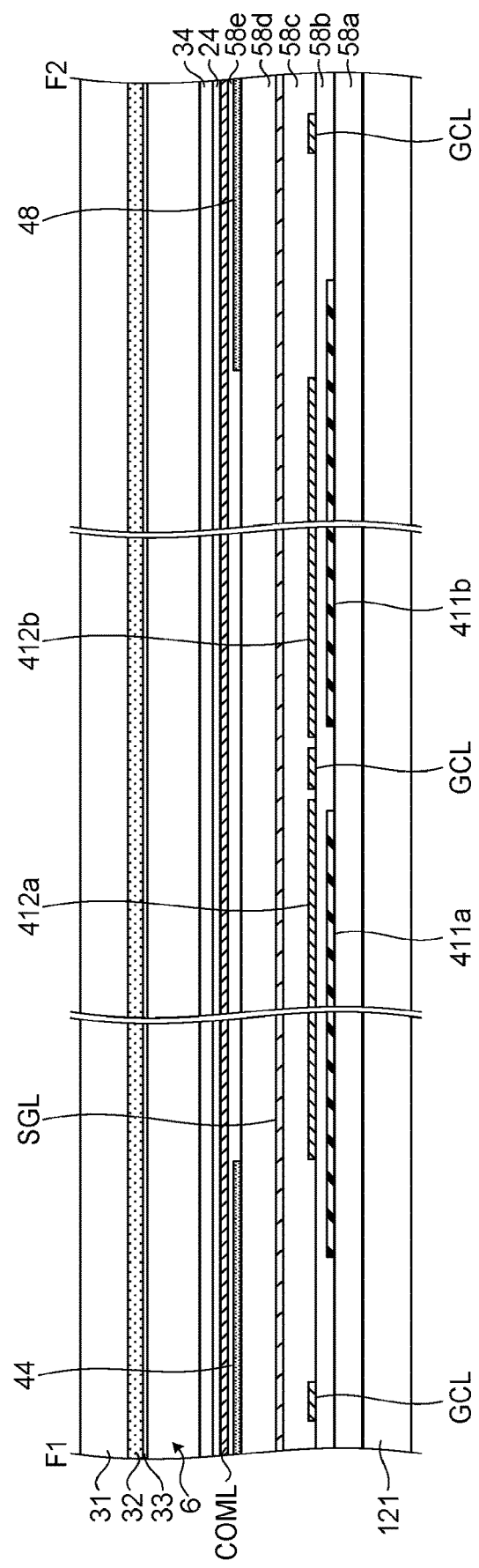
FIG. 18 is a sectional view cut along line F1-F2 in FIG. 16A.

FIG. 14 is a block diagram illustrating a first configuration example of a force detector according to a second embodiment. FIG. 15 is a block diagram illustrating a second configuration example of the force detector in the second embodiment. FIG. 16A is a plan view illustrating a first configuration example of a first semiconductor force sensor in the second embodiment. FIG. 16B is an enlarged view of the first semiconductor force sensor illustrated in FIG. 16A. FIG. 16B omits illustration of the gate lines GCL and the signal lines SGL in order to make a coupling relation between the wiring lines 44, 45, 47, and 48 provided on the insulating layer 58d, semiconductor resistor elements 411a and 411b, and gate electrodes 412a and 412b easy to view. FIG. 16C is an enlarged view of the first semiconductor force sensor that is illustrated in FIG. 16B while omitting the gate electrodes. FIG. 16D is an enlarged view of the first semiconductor force sensor that is illustrated in FIG. 16B while omitting the wiring lines. FIG. 17 is a sectional view cut along line E1-E2 in FIG. 16A. FIG. 18 is a sectional view cut along line F1-F2 in FIG. 16A. FIG. 19 is a sectional view cut along line G1-G2 in FIG. 16A. FIG. 16A to FIG. 19 omit components of the pixels Pix illustrated in FIG. 3. Duplicated explanation of components that are equivalent to or the same as those described in the above-mentioned first embodiment is omitted.

As illustrated in FIG. 14 or FIG. 15, a first semiconductor force sensor 41a and a second semiconductor force sensor 42a each include a TFT transistor (transistor element) in a force detector 40a in the second embodiment. Hereinafter, the specific configuration of the first semiconductor force sensor 41a will be described. The second semiconductor force sensor 42a has electric characteristics equivalent to those of the first semiconductor force sensor 41a, as in the first embodiment. That is to say, the second semiconductor force sensor 42a includes semiconductor resistor elements provided in the same layer as the semiconductor layers 61 in the frame region 11b, and resistance values of the semiconductor resistor elements are equivalent to resistance values of the semiconductor resistor elements 411a and 411b of the first semiconductor force sensors 41a when no force is applied to the display region 11a.

As illustrated in FIG. 16A to FIG. 19, the first semiconductor force sensor 41a includes the two semiconductor resistor elements 411a and 411b that are coupled to each other by the wiring line 48 (first wiring) provided on the insulating layer 58d at an intersection between the gate line GCL and the signal line SGL. The first semiconductor force sensor 41a includes the two gate electrodes 412a and 412b that are coupled to each other by the wiring line 47 (second wiring) provided on the insulating layer 58d at the intersection between the gate line GCL and the signal line SGL.

One end of the semiconductor resistor element 411a is coupled to the wiring line 44 provided on the insulating layer 58d through a contact hole H31 and a contact hole H32, as illustrated in FIG. 17. The other end of the semiconductor resistor element 411a is coupled to the wiring line 48 (first wiring) provided on the insulating layer 58d through a contact hole H34 and a contact hole H35, as illustrated in FIG. 19. The coupling configuration of the semiconductor resistor element 411b is similar to that of the semiconductor resistor element 411a, and explanation thereof is therefore omitted.

The gate electrode 412a is coupled to the wiring line 47 (second wiring) provided on the insulating layer 58d through a contact hole H36 and a contact hole H37, as illustrated in FIG. 19. The coupling configuration of the gate electrode 412b is similar to that of the gate electrode 412a, and explanation thereof is therefore omitted.

With the above-mentioned configuration, TFT transistors (transistor elements) through which current in accordance with a gate voltage VG (see FIG. 14 or FIG. 15) to be applied to the gate electrodes 412a and 412b flows are formed.

As illustrated in FIG. 14 and FIG. 15, the gate voltage VG may be applied from a detection circuit 43a through the wiring line 47 (second wiring) or may be applied from another component differing from the detection circuit 43a, for example. The component that applies the gate voltage VG does not limit the present disclosure.

Although FIG. 16A to FIG. 16D illustrate the example in which the wiring line 47 (second wiring) is extended to the upper side in the drawings as with the wiring line 44 and the wiring line 45, the extension direction of the wiring line 47 (second wiring) is not limited thereto.

Figure 20A:
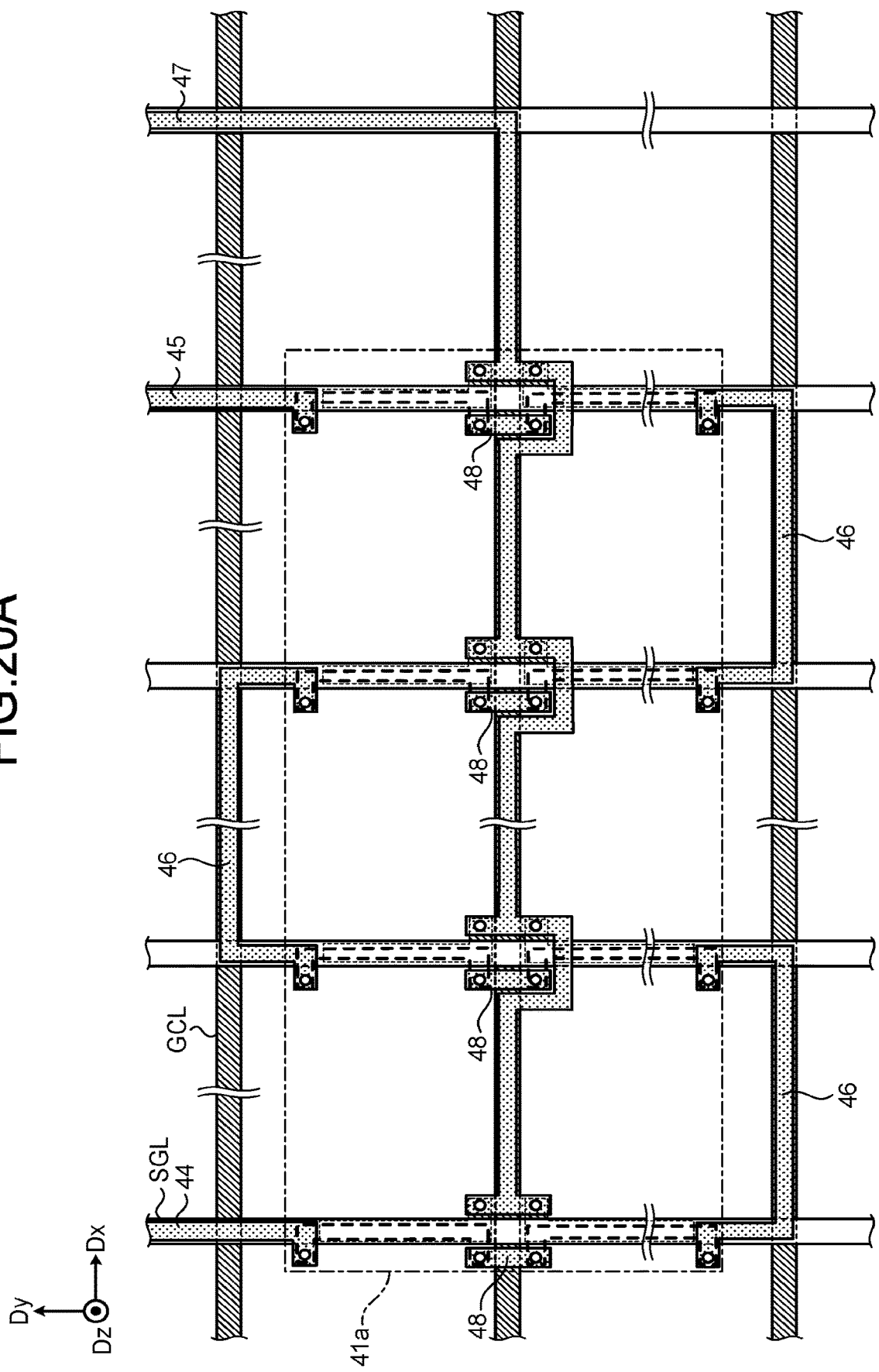
FIG. 20A is a plan view illustrating a second configuration example of the first semiconductor force sensor in the second embodiment.
Figure 20D:
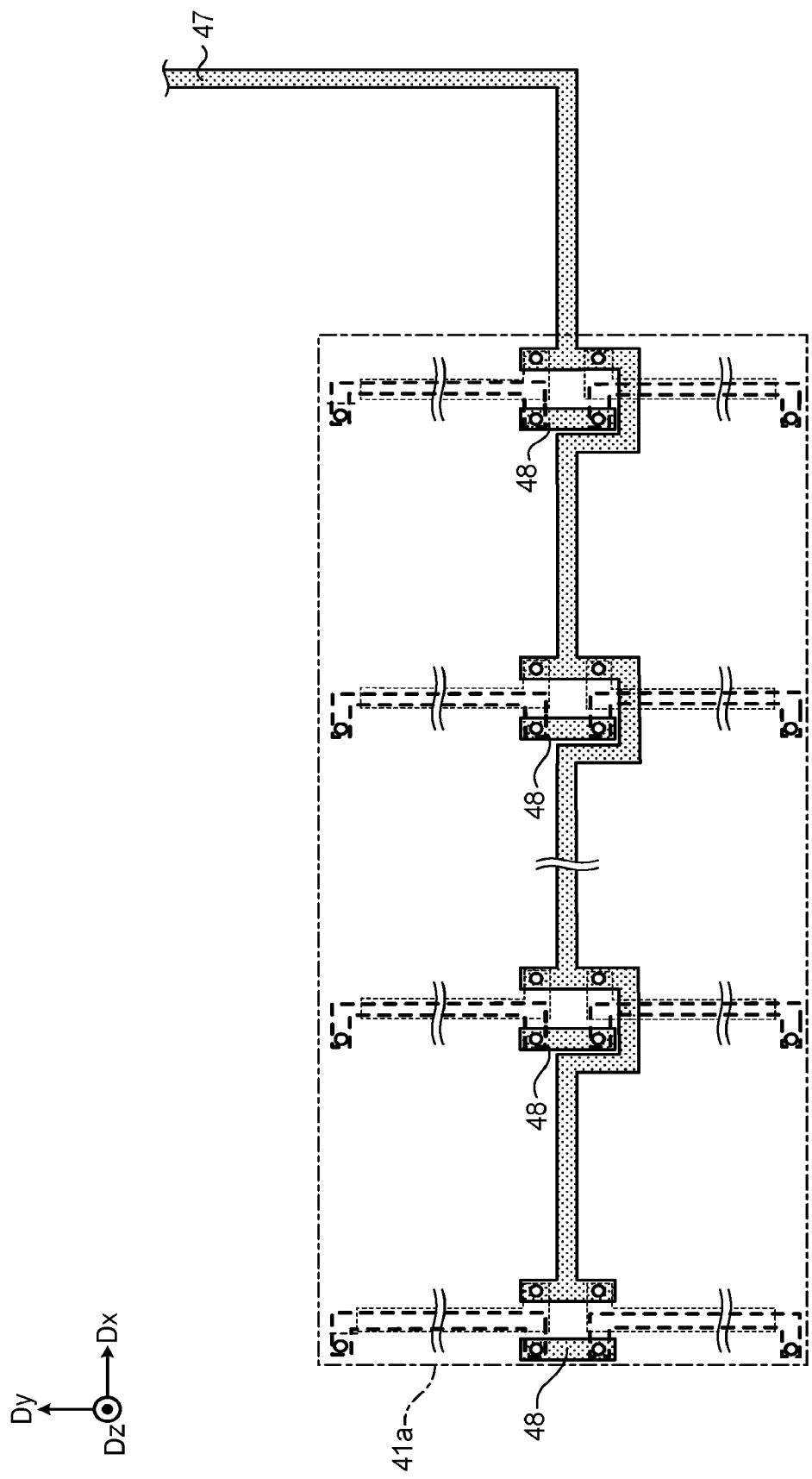
FIG. 20D is a plan view illustrating the second configuration example of the first semiconductor force sensor that is illustrated in FIG. 20B while further omitting wiring lines.

FIG. 20A is a plan view illustrating a second configuration example of the first semiconductor force sensor in the second embodiment. FIG. 20B is a plan view illustrating the second configuration example of the first semiconductor force sensor that is illustrated in FIG. 20A while omitting the gate lines and the signal lines. FIG. 20C is a plan view illustrating the second configuration example of the first semiconductor force sensor that is illustrated in FIG. 20B while further omitting the gate electrodes. FIG. 20D is a plan view illustrating the second configuration example of the first semiconductor force sensor that is illustrated in FIG. 20B while further omitting the wiring lines.

The second configuration example illustrated in FIG. 20A to FIG. 20D is different from the first configuration example illustrated in FIG. 16A to 16D in the point that the first semiconductor force sensor 41 is configured such that a plurality of TFT transistors (transistor elements) are coupled in series. The TFT transistors (transistor elements) are coupled to each other by the wiring lines 46 (third wiring) provided on the insulating layer 58d through contact holes. A plurality of columns of the semiconductor resistor elements 411 extending in the column direction (Dy direction) are included in the second configuration example illustrated in FIG. 20A to 20D.

FIG. 21A is a plan view illustrating a third configuration example of the first semiconductor force sensor in the second embodiment. FIG. 21B is a plan view illustrating the third configuration example of the first semiconductor force sensor that is illustrated in FIG. 21A while omitting the gate lines and the signal lines. FIG. 21C is a plan view illustrating the third configuration example of the first semiconductor force sensor that is illustrated in FIG. 21B while further omitting the gate electrodes. FIG. 21D is a plan view illustrating the third configuration example of the first semiconductor force sensor that is illustrated in FIG. 21B while further omitting the wiring lines.

The third configuration example illustrated in FIG. 21A to FIG. 21D is different from the second configuration example illustrated in FIG. 20A to FIG. 20D in the point that the semiconductor resistor elements 411 extend in the row direction along the gate lines GCL. The first semiconductor force sensor 41a illustrated in FIG. 21A to FIG. 21D is configured such that gate electrodes 412 provided on the insulating layer 58b overlap with the semiconductor resistor elements 411 to form the TFT transistors (transistor elements). A plurality of rows of the semiconductor resistor elements 411 extending in the row direction (Dx direction) are included in the third configuration example illustrated in FIG. 21A to FIG. 21D.

Figure 22A:
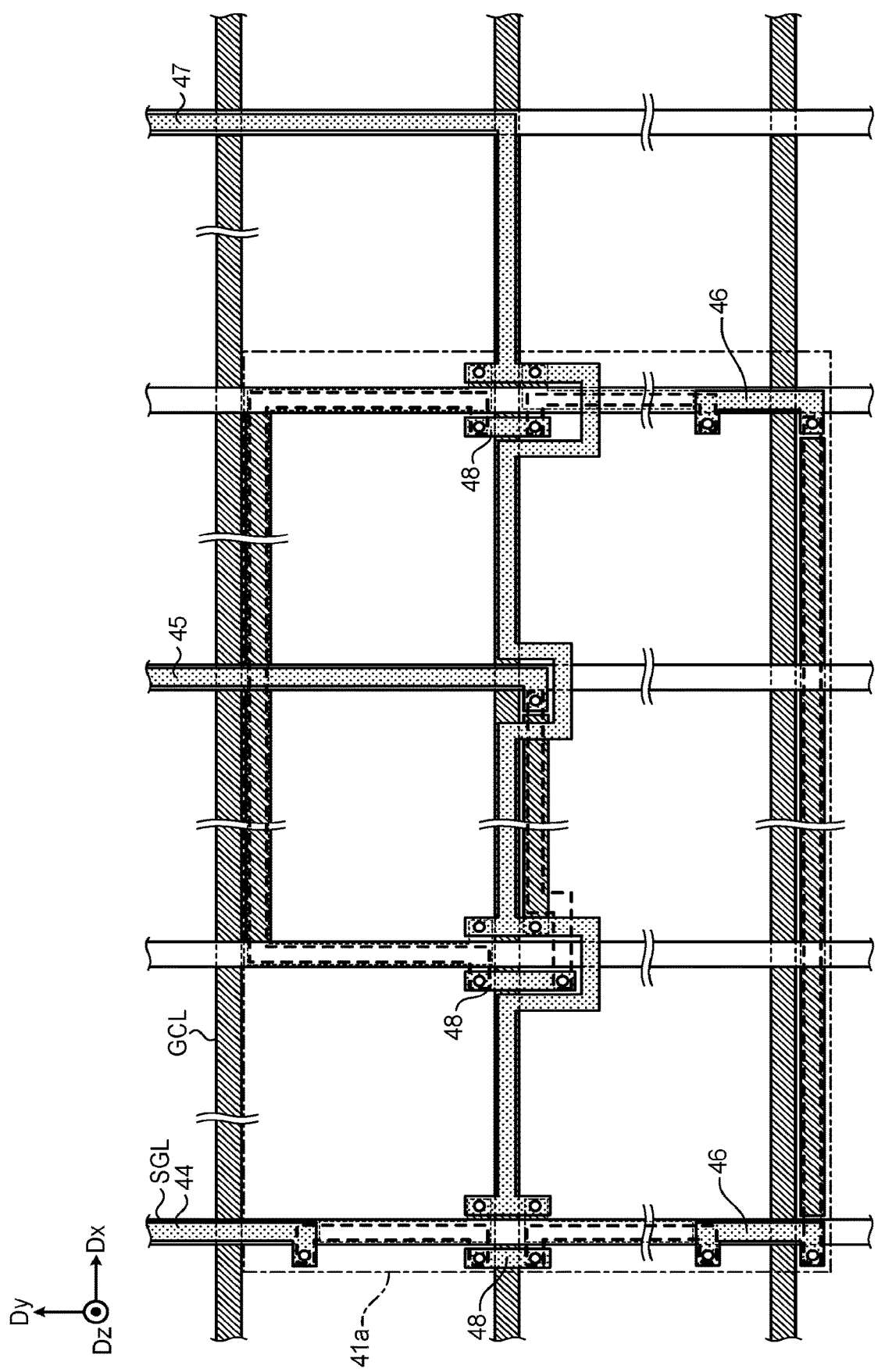
FIG. 22A is a plan view illustrating a fourth configuration example of the first semiconductor force sensor in the second embodiment.
Figure 22B:
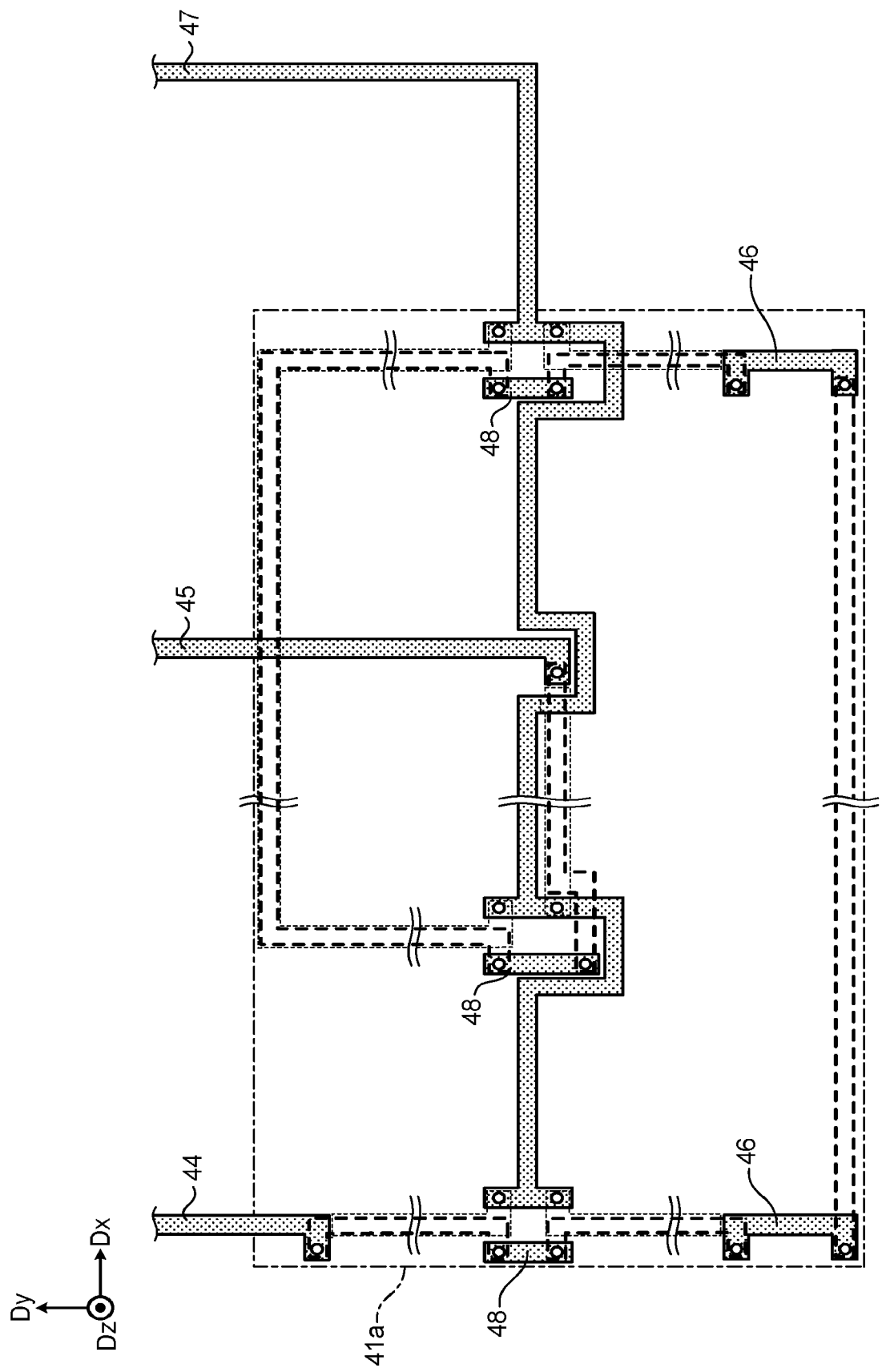
FIG. 22B is a plan view illustrating the fourth configuration example of the first semiconductor force sensor that is illustrated in FIG. 22A while omitting the gate lines and the signal lines.
Figure 22D:
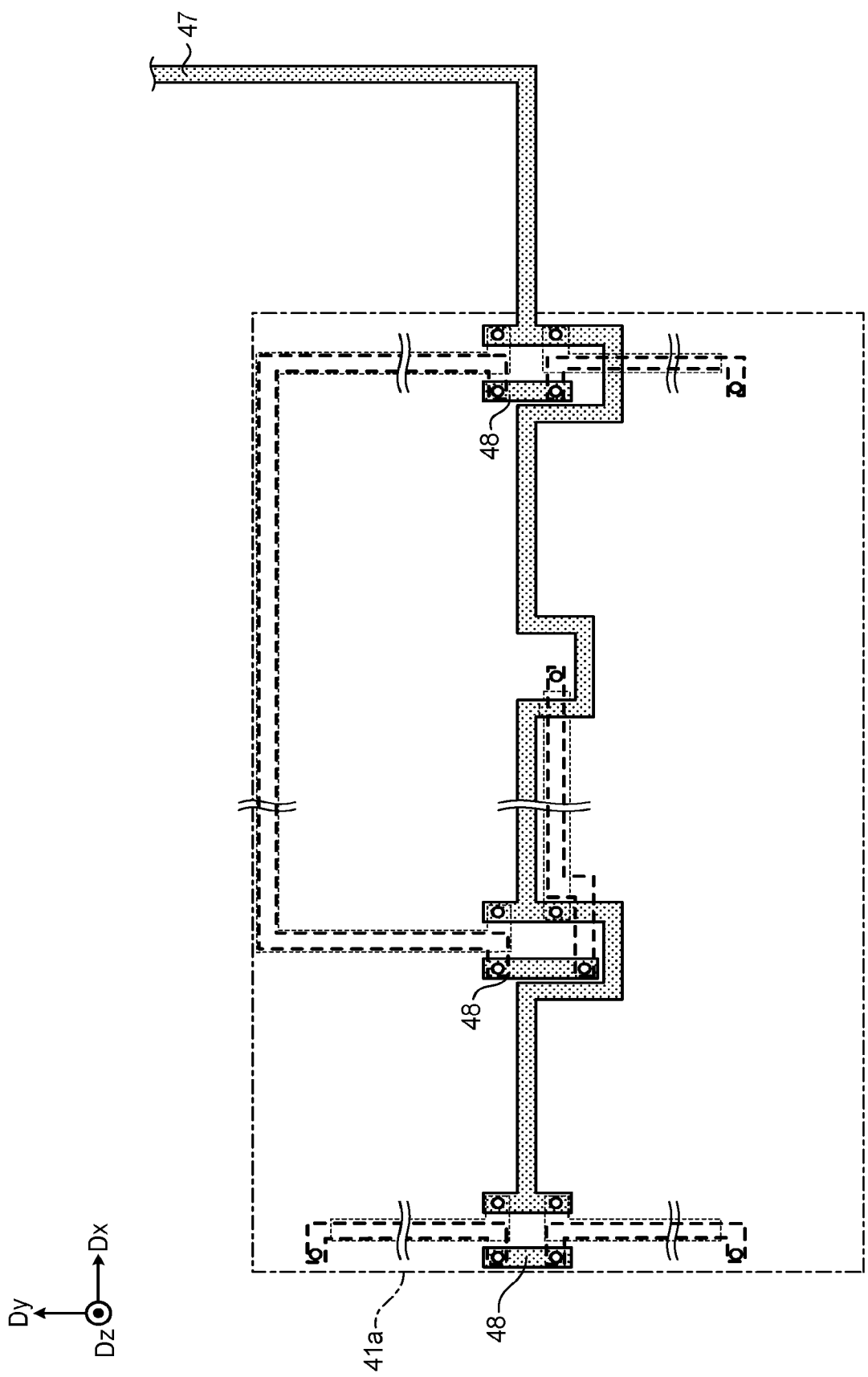
FIG. 22D is a plan view illustrating the fourth configuration example of the first semiconductor force sensor that is illustrated in FIG. 22B while further omitting the wiring lines.

FIG. 22A is a plan view illustrating a fourth configuration example of the first semiconductor force sensor in the second embodiment. FIG. 22B is a plan view illustrating the fourth configuration example of the first semiconductor force sensor that is illustrated in FIG. 22A while omitting the gate lines and the signal lines. FIG. 22C is a plan view illustrating the fourth configuration example of the first semiconductor force sensor that is illustrated in FIG. 22B while further omitting the gate electrodes. FIG. 22D is a plan view illustrating the fourth configuration example of the first semiconductor force sensor that is illustrated in FIG. 22B while further omitting the wiring lines.

The fourth configuration example illustrated in FIG. 22A to FIG. 22D is a combination of the second configuration example illustrated in FIG. 20A to FIG. 20D and the third configuration example illustrated in FIG. 21A to FIG. 21D and includes both the semiconductor resistor elements 411a and 411b extending in the column direction (Dy direction) and the semiconductor resistor elements 411 extending in the row direction (Dx direction). FIG. 22A to FIG. 22D illustrate an example in which the semiconductor resistor elements 411, 411a, and 411b are arranged in a spiral form.

The TFT transistors (transistor elements) included in the first semiconductor force sensor 41a are coupled in series by the wiring lines 46 (third wiring) provided on the insulating layer 58d in each of the configuration examples illustrated in FIG. 20A to FIG. 20D, FIG. 21A to FIG. 21D, and FIG. 22A to FIG. 22D. With this configuration, the resistance value of the first semiconductor force sensor 41a can be made larger than that in the first configuration example illustrated in FIG. 16A to FIG. 16D. Increase in the resistance values of the first semiconductor force sensor 41a and the second semiconductor force sensor 42a increases the amount of variation in the resistance value caused by the force applied to the display region 11a, thereby enhancing the detection accuracy of the force applied to the display region 11a.

Figure 23:
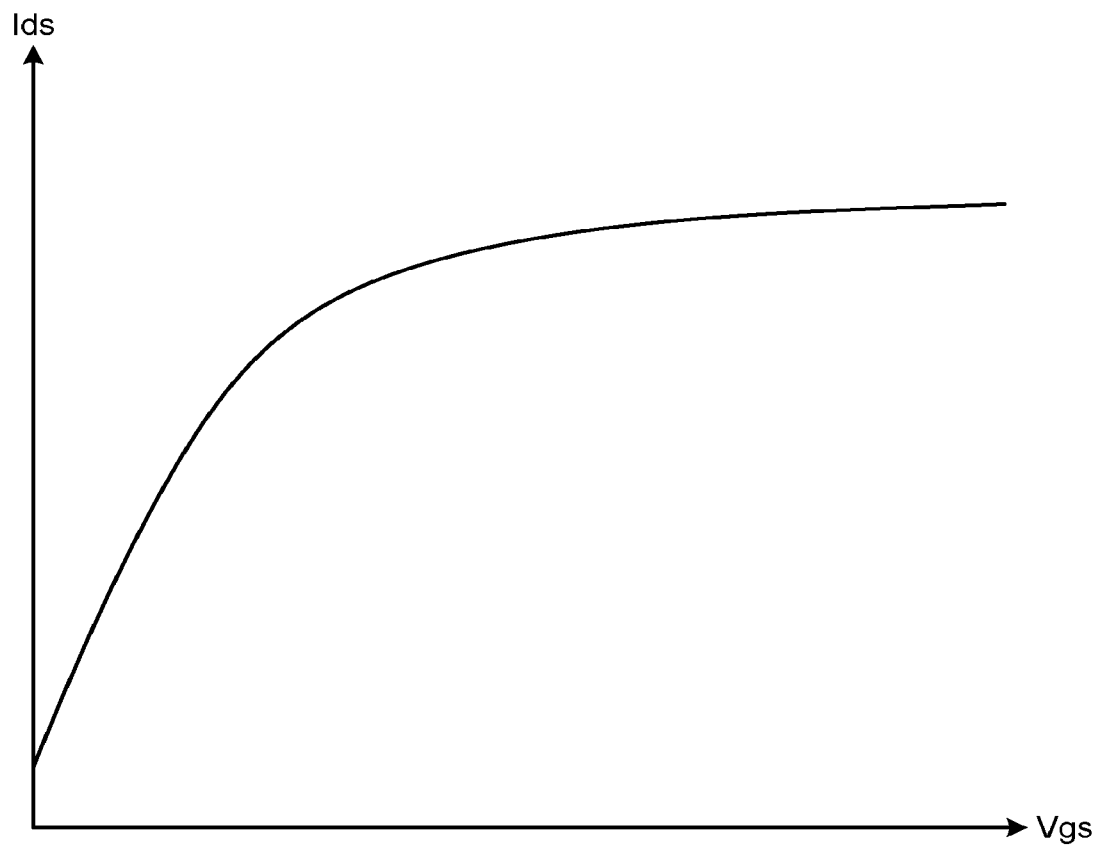
FIG. 23 is a graph illustrating a relation between a gate-source voltage and a drain-source current of a TFT transistor.

FIG. 23 is a graph illustrating a relation between a gate-source voltage and a drain-source current of the TFT transistor. As illustrated in FIG. 23, a drain-source current Ids changes in accordance with a gate-source voltage Vgs. That is to say, change in the gate-source voltage Vgs changes an ON resistance of the TFT transistor.

In the embodiment, the resistance values of the first semiconductor force sensor 41a and the second semiconductor force sensor 42a can be changed by adjusting the gate voltage VG (see FIG. 14 or FIG. 15). When the first semiconductor force sensors 41a are arranged at a plurality of places in the display region 11a, for example, the detection values for the force applied to the display region 11a can be substantially constant by setting the gate voltages VG to different values.

As described above, the first semiconductor force sensor 41a is configured such that the gate electrodes 412, 412a, and 412b provided on the insulating layer 58b overlap with the semiconductor resistor elements 411, 411a, and 411b to form the TFT transistors (transistor elements) in the second embodiment.

To be specific, the two semiconductor resistor elements 411a and 411b are coupled to each other by the wiring line 48 (first wiring) provided on the insulating layer 58d at the intersection between the gate line GCL and the signal line SGL in the configuration in which the semiconductor resistor elements 411a and 411b overlap with the signal line SGL and extend in the column direction (Dy direction). The first semiconductor force sensor 41a includes the two gate electrodes 412a and 412b coupled to each other by the wiring line 47 (second wiring) provided on the insulating layer 58d at the intersection between the gate line GCL and the signal line SGL.

With this configuration, the force applied to the display region 11a can be detected using the first semiconductor force sensor 41a including the TFT transistors (transistor elements) while hampering the aperture ratio of the pixels Pix from being lowered.

The resistance value of the first semiconductor force sensor 41a can be made larger than that in the first configuration example illustrated in FIGS. 16A to 16D by coupling the TFT transistors (transistor elements) included in the first semiconductor force sensor 41a in series by the wiring lines 46 (third wiring) provided on the insulating layer 58d. With this configuration, the detection accuracy of the force applied to the display region 11a can be enhanced.

The embodiment can provide the configuration detecting the force applied to the display surface at low cost.

Although the preferred embodiments of the present disclosure have been described above, the present disclosure is not limited by these embodiments. Contents disclosed in the embodiments are merely examples, and various modifications can be made in a range without departing from the gist of the present disclosure. Although, for example, the liquid crystal display device capable of achieving color display has been described in the first embodiment, the present disclosure is not limited to the liquid crystal display device capable of achieving color display and may be a liquid crystal display device compatible with monochromatic display. It is needless to say that appropriate modifications in a range without departing from the gist of the present disclosure belong to the technical range of the present disclosure.

For example, a display device according to the present disclosure can employ the following aspects.

(1). A display device includes a display region in which a plurality of pixels are arrayed in a row direction and a column direction. Gate lines each configured to supply gate signals to the pixels are aligned in the row direction. Signal lines each configured to supply pixel signals to the pixels aligned in the column direction. At least one first semiconductor force sensor is provided in the display region. At least one second semiconductor force sensor is provided in a frame region outside the display region. A detection circuit detects force applied to the display region based on a middle-point voltage between the first semiconductor force sensor and the second semiconductor force sensor.

(2). Further in the display device a resistance value of the first semiconductor force sensor and a resistance value of the second semiconductor force sensor can be equivalent to each other when no force is applied.

(3). Further in the display device each of the pixels can include a pixel transistor including a semiconductor layer, and each of the first semiconductor force sensor and the second semiconductor force sensor can include a semiconductor resistor element provided in the same layer as the semiconductor layers of the pixel transistors.

(4). Further in the display device the semiconductor resistor element of the first semiconductor force sensor can overlap with one of the signal lines and extends in the column direction.

(5). Further in the display device the semiconductor resistor element of the first semiconductor force sensor can extend in the row direction along the gate lines.

(6). Further in the display device the first semiconductor force sensor can be configured such that a plurality of the semiconductor resistor elements are coupled in series by wiring provided in a layer differing from layers of the gate lines, the signal lines, and the semiconductor resistor elements.

(7). Further in the display device the first semiconductor force sensor can further include a transistor element further including a gate electrode, and the gate electrode can be provided in the same layer as a layer of the gate lines and with the semiconductor resistor element.

(8). Further in the display device the first semiconductor force sensor can include the transistor element that can include: two of the semiconductor resistor elements that are coupled to each other by first wiring provided in a layer differing from layers of the gate lines, the signal lines, and the semiconductor resistor elements at an intersection between one of the gate lines and one of the signal lines, and two of the gate electrodes that are coupled to each other by second wiring provided in the same layer as a layer of the first wiring at the intersection.

(9). Further in the display device the first semiconductor force sensor can be configured such that a plurality of the transistors are coupled in series by third wiring provided in a layer differing from the gate lines, the signal lines, and the semiconductor resistor element.

(10). Further in the display device two of the first semiconductor force sensors and two of the second semiconductor force sensors can be included to form a Wheatstone bridge circuit.

(11). Further in the display device a plurality of the first semiconductor force sensors can be arranged at a plurality of places in the display region.

What is claimed is:

1. A display device comprising:
   a display region in which a plurality of pixels are arrayed in a row direction and a column direction;
   gate lines each of which is configured to supply gate signals to the pixels aligned in the row direction;
   signal lines each of which is configured to supply pixel signals to the pixels aligned in the column direction;
   at least one first semiconductor force sensor provided in the display region;
   at least one second semiconductor force sensor provided in a frame region outside the display region; and
   a detection circuit that detects force applied to the display region based on a middle-point voltage between the first semiconductor force sensor and the second semiconductor force sensor.

2. The display device according to claim 1, wherein a resistance value of the first semiconductor force sensor and a resistance value of the second semiconductor force sensor are equivalent to each other when no force is applied.

3. The display device according to claim 1, wherein
   each of the pixels comprises a pixel transistor including a semiconductor layer, and
   each of the first semiconductor force sensor and the second semiconductor force sensor comprises a semiconductor resistor element provided in the same layer as the semiconductor layers of the pixel transistors.

4. The display device according to claim 3, wherein the semiconductor resistor element of the first semiconductor force sensor overlaps with one of the signal lines and extends in the column direction.

5. The display device according to claim 4, wherein the first semiconductor force sensor is configured such that a plurality of the semiconductor resistor elements are coupled in series by wiring provided in a layer differing from layers of the gate lines, the signal lines, and the semiconductor resistor elements.

6. The display device according to claim 4, wherein the first semiconductor force sensor comprises a transistor element further including a gate electrode, and the gate electrode is provided in the same layer as a layer of the gate lines and overlaps with the semiconductor resistor element.

7. The display device according to claim 6, wherein the first semiconductor force sensor comprises the transistor element including:
- two of the semiconductor resistor elements that are coupled to each other by first wiring provided in a layer differing from layers of the gate lines, the signal lines, and the semiconductor resistor elements at an intersection between one of the gate lines and one of the signal lines, and
- two of the gate electrodes that are coupled to each other by second wiring provided in the same layer as a layer of the first wiring at the intersection.

8. The display device according to claim 6, wherein the first semiconductor force sensor is configured such that a plurality of the transistor elements are coupled in series by third wiring provided in a layer differing from layers of the gate lines, the signal lines, and the semiconductor resistor element.

9. The display device according to claim 3, wherein the semiconductor resistor element of the first semiconductor force sensor extends in the row direction along the gate lines.

10. The display device according to claim 9, wherein the first semiconductor force sensor is configured such that a plurality of the semiconductor resistor elements are coupled in series by wiring provided in a layer differing from layers of the gate lines, the signal lines, and the semiconductor resistor elements.

11. The display device according to claim 9, wherein the first semiconductor force sensor comprises a transistor element further including a gate electrode, and the gate electrode is provided in the same layer as a layer of the gate lines and overlaps with the semiconductor resistor element.

12. The display device according to claim 11, wherein the first semiconductor force sensor comprises the transistor element including:
- two of the semiconductor resistor elements that are coupled to each other by first wiring provided in a layer differing from layers of the gate lines, the signal lines, and the semiconductor resistor elements at an intersection between one of the gate lines and one of the signal lines, and
- two of the gate electrodes that are coupled to each other by second wiring provided in the same layer as a layer of the first wiring at the intersection.

13. The display device according to claim 11, wherein the first semiconductor force sensor is configured such that a plurality of the transistor elements are coupled in series by third wiring provided in a layer differing from layers of the gate lines, the signal lines, and the semiconductor resistor element.

14. The display device according to claim 1, wherein two of the first semiconductor force sensors and two of the second semiconductor force sensors are included to form a Wheatstone bridge circuit.

15. The display device according to claim 1, wherein a plurality of the first semiconductor force sensors are arranged at a plurality of places in the display region.

* * * * *